(12) United States Patent
Shimura et al.

(10) Patent No.: US 11,535,766 B2
(45) Date of Patent: Dec. 27, 2022

(54) CURABLE COMPOSITION FOR INKJET PRINTING, CURED PRODUCT OF SAME, AND ELECTRONIC COMPONENT HAVING THE CURED PRODUCT

(71) Applicant: TAIYO INK MFG. CO., LTD., Hiki-gun (JP)

(72) Inventors: Masayuki Shimura, Hiki-gun (JP); Hideyuki Ito, Hiki-gun (JP); Hiroshi Matsumoto, Hiki-gun (JP); Xiaozhu Wei, Hiki-gun (JP); Rina Yoshikawa, Hiki-gun (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 0 days.

(21) Appl. No.: 17/042,540

(22) PCT Filed: Mar. 26, 2019

(86) PCT No.: PCT/JP2019/012819
§ 371 (c)(1),
(2) Date: Sep. 28, 2020

(87) PCT Pub. No.: WO2019/189157
PCT Pub. Date: Oct. 3, 2019

(65) Prior Publication Data
US 2021/0032483 A1    Feb. 4, 2021

(30) Foreign Application Priority Data

Mar. 30, 2018  (JP) .............................. JP2018-069537
Mar. 30, 2018  (JP) .............................. JP2018-069671

(51) Int. Cl.
*C09D 11/101*   (2014.01)
*B41M 5/00*     (2006.01)
*C09D 11/30*    (2014.01)

(52) U.S. Cl.
CPC ......... *C09D 11/101* (2013.01); *B41M 5/0023* (2013.01); *C09D 11/30* (2013.01)

(58) Field of Classification Search
CPC ...... C09D 11/101; C09D 11/30; C09D 11/322
See application file for complete search history.

(56) References Cited

U.S. PATENT DOCUMENTS

| | | |
|---|---|---|
| 2011/0024392 A1 | 2/2011 | Sato et al. |
| 2012/0252919 A1 | 10/2012 | Suzuki et al. |
| 2014/0053753 A1 | 2/2014 | Suzuki et al. |
| 2014/0104356 A1 | 4/2014 | Kitade et al. |
| 2015/0368493 A1 | 12/2015 | Yamada |
| 2018/0171037 A1* | 6/2018 | Miyano ................ C09D 11/101 |

FOREIGN PATENT DOCUMENTS

| | | |
|---|---|---|
| CN | 101978001 A | 2/2011 |
| CN | 103619971 A | 3/2014 |
| CN | 105765010 A | 7/2016 |
| EP | 3 091 037 A1 | 11/2016 |
| JP | 2009-51892 A | 3/2009 |
| JP | 2009-235272 A | 10/2009 |
| JP | 2010-76271 A | 4/2010 |
| JP | 2010-229378 A | 10/2010 |
| JP | 2012-67222 A | 4/2012 |
| JP | 2012-103586 A | 5/2012 |
| JP | 2012-162615 A | 8/2012 |
| JP | 2012-162616 A | 8/2012 |
| JP | 2012-163594 A | 8/2012 |
| JP | 2014-136795 A | 7/2014 |
| JP | 2016-124907 A | 7/2016 |
| JP | 2016-196579 A | 11/2016 |
| JP | 2017-8264 A | 1/2017 |
| JP | 2017-83668 A | 5/2017 |
| WO | WO 2012/172973 A1 | 12/2012 |
| WO | WO 2013/146706 A1 | 10/2013 |
| WO | WO 2015/080155 A1 | 6/2015 |
| WO | WO 2017/047615 A1 | 3/2017 |

OTHER PUBLICATIONS

International Search Report dated Jul. 2, 2019 in PCT/JP2019/012819 filed on Mar. 26, 2019, 4 pages.
Notice of Reasons for Refusal dated Jan. 25, 2022 in Japanese Patent Application No. 2018-069537 (with English language translation), 12 pages.
Notice of Reasons for Refusal dated Jan. 25, 2022 in Japanese Patent Application No. 2018-069671 (with English language translation), 9 pages.

(Continued)

*Primary Examiner* — Sanza L. McClendon
(74) *Attorney, Agent, or Firm* — Oblon, McClelland, Maier & Neustadt, L.L.P.

(57) ABSTRACT

[Problem to be Solved] Provided is a curable composition for inkjet printing, a coating film obtained from which has higher heat resistance than conventional coating films.
[Solution] It is a curable composition for inkjet printing, comprising (A) a (meth)acrylate monomer having a cyclic skeleton and having a number of alkylene oxide modifications of one or more and six or less, (B1) a bifunctional (meth)acrylate monomer having no cyclic skeleton and having two or more alkylene glycol structures, (B2) a bifunctional (meth)acrylate monomer having no cyclic skeleton and having a monoalkylene glycol structure, and (C) a photopolymerization initiator. Accordingly, an obtained coating film does not crack, has excellent adhesion to a conductor, and maintains sufficient hardness even after a thermal history that corresponds to a plurality of times of soldering. The above problem to be solved is also solved by a curable composition for inkjet printing, comprising (A') a (meth) acrylate monomer having a cyclic skeleton and having a number of alkylene oxide modifications of one or more and six or less, (B1') a bifunctional (meth)acrylate monomer having no cyclic skeleton and having two or more alkylene glycol structures, (B2') a bifunctional (meth)acrylate monomer having no cyclic skeleton and having a monoalkylene glycol structure, and (C') a photopolymerization initiator.

20 Claims, 1 Drawing Sheet

(56) References Cited

OTHER PUBLICATIONS

Combined Chinese Office Action and Search Report dated Jan. 28, 2022 in Chinese Patent Application No. 201980020841.X (with English translation of Category of Documents). 8 pages.
Electron Beam Curing Coatings and Application, the first edition, Dec. 31, 2014, p. 209.
Encyclopedia of Industrial Chemical Auxiliary (continuation), Aug. 31, 1991, pp. 97-99.
Extended European Search Report dated Mar. 30, 2022 in European Patent Application No. 19775320.5, 15 pages.
Partial Supplementary European Search Report dated Dec. 9, 2021 in European Patent Application No. 19775320.5, 14 pages.

\* cited by examiner

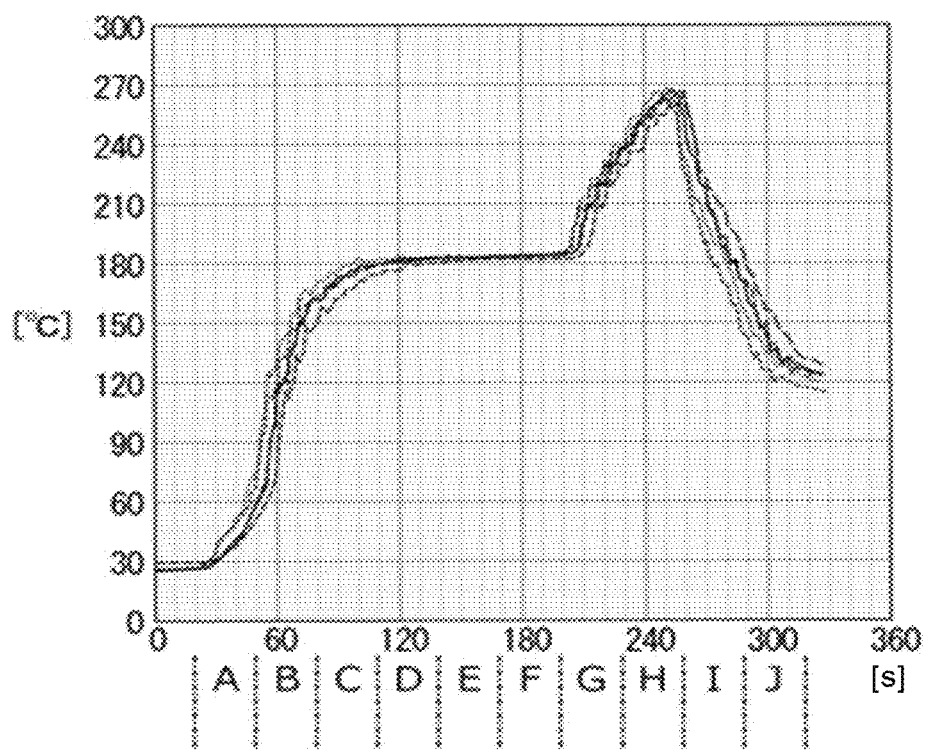

CURABLE COMPOSITION FOR INKJET PRINTING, CURED PRODUCT OF SAME, AND ELECTRONIC COMPONENT HAVING THE CURED PRODUCT

CROSS-REFERENCE TO RELATED APPLICATIONS

This application is a national stage application of International Application No. PCT/JP2019/012819, filed Mar. 26, 2019, which is based upon and claims the benefit of priority to Japanese Patent Applications No. 2018-069537, filed Mar. 30, 2018 and No. 2018-069671, filed Mar. 30, 2018. The entire contents of these applications are incorporated herein by reference.

TECHNICAL FIELD

The present invention relates to a curable composition and, in particular, relates to a curable composition applicable to printing by an inkjet method. Also, the present invention relates to a cured product of the curable composition and an electronic component having the cured product.

BACKGROUND ART

Curable compositions used in thermally curable, UV-curable, and alkali-developable solder resists known to date contain high molecular weight polymers in the compositions according to requirements such as heat resistance. However, in the case of reducing the viscosity of the curable compositions for application to inkjet printing, such high molecular weight polymers are highly viscous and cannot be used.

Accordingly, in recent years, the formulation of curable compositions for use in solder resists for inkjet printing has been designed, with a focus on a low viscosity monomer. For example, Patent Literature 1 discloses a curable composition usable in printing by an inkjet method.

The curable composition of Patent Literature 1 has a formulation mainly composed of a monomer, thus has a low viscosity, is applicable as an inkjet printer ink, and enables a pattern to be directly printed onto a substrate for a printed wiring board. Accordingly, the labor of resist pattern formation by exposure and development as in a conventional photographic developing method can be eliminated, and the amounts of materials such as a photosensitive resin material, a developer, and a cleaning solvent used to form a resist pattern can be reduced.

Likewise, engraving as in resist pattern formation by a screen printing method is not required, thus such labor is eliminated, and also the amounts of materials used such as an emulsion can be reduced.

Patent Literature 2 discloses a (meth) acrylamide-based urethane oligomer having one or two or more skeletons selected from ether skeletons, ester skeletons, silicone skeletons, and acrylic skeletons within the molecule, having one or more (meth) acrylamide groups, and having a shrinkage of 5.0% or less before and after active energy curing. Having an active energy ray shrinkage of 5% or less and thus having excellent shrink resistance, this (meth) acrylamide-based urethane oligomer enables a cured film having adhesion, shrink resistance, and high humidity and heat resistance to be prepared, and, by being mixed with a monofunctional or polyfunctional monomer, an ionic monomer, an active energy ray polymerization initiator, a pigment, or the like as necessary, is used in photocurable resist applications as an active energy ray curable inkjet ink composition.

Patent Literature 3 discloses an ink composition used when producing a color filter for use in color liquid crystal display apparatuses and the like, wherein the ink composition contains at least a coloring agent composed of a dye, a thermosetting binder component, and a solvent, and the shrinkage of the thermosetting binder component when thermally cured is 50% or less. As for this ink composition, the heat shrinkage of the thermosetting binder component is low, and thus the surface irregularities of a color filter can be flattened.

Patent Literature 4, as with Patent Literature 1, discloses a photocurable inkjet ink containing a radically polymerizable urethane (meth) acrylate oligomer, at least one radically polymerizable monomer, a radical photopolymerization initiator, and a non-reactive glycol ether diluent.

Patent Literature 5 discloses an active energy ray curable composition for an optical component, which is not a resin composition for inkjet but is usable in formation of a solder resist for flexible printed wiring. Specifically, this active energy ray curable composition for an optical component contains (A) a urethane polyfunctional (meth) acrylate oligomer, (B) a bifunctional polyoxyalkylene polyol (meth) acrylate not containing an aromatic ring, (C) 10 to 40% by weight of a tri- to hexafunctional (meth) acrylate not containing a urethane group based on the total amount of components (A) to (D), (D) a monofunctional (meth)acrylate, and (E) a photopolymerization initiator.

PRIOR ART LITERATURE

Patent Literature

Patent Literature 1

International Publication No. WO 2013/146706

Patent Literature 2

International Publication No. WO 2017/047615

Patent Literature 3

Japanese Patent Laid-Open No. 2012-163594

Patent Literature 4

Japanese Patent Laid-Open No. 2016-124907

Patent Literature 5

Japanese Patent Laid-Open No. 2017-083668

SUMMARY OF INVENTION

Problems to be Solved by the Invention

However, conventional curable compositions used in an inkjet printing method, such as the curable composition of Patent Literature 1, are composed primarily of a monomer, and it is thus conjectured that such curable compositions have a low molecular weight and a low viscosity, and cured products after curing the compositions have a lower molecular weight than cured products of compositions mainly composed of a polymer.

Accordingly, it was found from research by the inventors that in the case where such curable compositions are used in the preparation of a solder resist for inkjet printing, it is difficult to obtain heat resistance comparable to that obtained when a polymer is used, and problems, such as cracks in a coating film due to a thermal history such as reflowing, arise.

Specifically, it has become clear that when mounting components onto a double-sided board having wiring that is printed on both surfaces of a substrate or a multilayer board obtained by laminating substrates, problems may arise such as peeling of a solder resist coating film from a conductor in a land that is a mounting site of components, and cracks in a solder resist itself, due to repetitive heating.

With the active energy ray curable inkjet ink composition of Patent Literature 2, a cured film having adhesion, shrink resistance, and high humidity and heat resistance can be prepared, but since the performance of a coating film that has undergone a thermal history such as reflow heating after UV irradiation is not evaluated, Patent Literature 2 is silent on a method for increasing the heat resistance of a coating film formed from the ink.

With the ink composition of Patent Literature 3, the surface irregularities of a color filter can be flattened due to the low thermal shrinkage of the thermosetting binder component, but since the film properties after thermal curing and reflow heating are not evaluated, Patent Literature 3 as with Patent Literature 2 is silent on a method for increasing the heat resistance of a formed coating film.

As for the photocurable inkjet ink of Patent Literature 4, the storage stability of the photocurable inkjet ink is increased due to the non-reactive glycol ether diluent, but Patent Literature 4 is silent on a method for increasing the heat resistance of a coating film formed from the ink.

The active energy ray curable composition for optical components of Patent Literature 5 is a composition mainly composed of an acrylate monomer as in Patent Literature 1, thus an obtained cured product is also considered to be susceptible to repetitive heating, and an example of its application is a solder resist for flexible printed wiring wherein the thermal history is relatively small. The active energy ray curable composition for optical components of Patent Literature 5 is not a composition for inkjet printing.

The present invention has been conceived in view of the above problems, and an object of the present invention is to provide a curable composition for inkjet printing, a coating film obtained from which has higher heat resistance than conventional coating films, a cured product thereof, and an electronic component in which the cured product is used.

Means for Solving the Problem

In order to increase the heat resistance of a curable composition mainly composed of a monomer, which is to be used in an inkjet printing method, the shrinkage of the monomer contained in the curable composition was mainly focused, and it has become clear from the research by the inventors that lowering the shrinkage can increase the crack resistance and other mechanical properties (adhesion to a conductor (solder heat resistance), coating film hardness, and chemical resistance (plating resistance)) of a film even after reflow heating.

Based on the above research results, the invention of the present application has been made in order to increase various properties of a coating film, including the heat resistance of the coating film, i.e., suppression of crack production after heating, solder heat resistance, and plating resistance. That is, it was found that the object of the present invention is achieved by a curable composition for inkjet printing containing:

(A) a photopolymerizable monomer having a cyclic skeleton and a shrinkage of less than 10%;

(B) a photopolymerizable bifunctional monomer having a viscosity at 25° C. of 100 mPa·s or less and a shrinkage of 10% or more and 20% or less; and (C) a photopolymerization initiator.

The curable composition for inkjet printing of the present invention preferably contains (B1) a photopolymerizable bifunctional monomer having a viscosity at 25° C. of 100 mPa·s or less and a shrinkage in the range of 10% or more and 15% or less as the photopolymerizable bifunctional monomer (B).

Moreover, in order to increase the heat resistance of a cured coating film of a curable composition mainly composed of an acrylate monomer for use in an inkjet printing method, research was conducted on the acrylate monomer to be blended, and it has become clear from the research by the inventors that, among diluent acrylate monomers added to lower viscosity, there are those that likely result in cracks in a coating film after repetitive heating while being superior in other mechanical properties (adhesion to a conductor, coating film hardness, chemical resistance, which are hereinafter also referred to as solder heat resistance), and those that suppress production of cracks after heating while having inferior solder heat resistance.

Another invention of the present application based on the above research results was made in order to increase the heat resistance of a coating film, i.e., the heat resistance of a coating film including suppressing production of cracks after heating. That is, it was found that this object of the present invention is achieved by a curable composition for inkjet printing, containing:

(A') a (meth) acrylate monomer having a cyclic skeleton and having a number of alkylene oxide modifications of one or more and six or less;

(B1') a bifunctional (meth) acrylate monomer having no cyclic skeleton and having two or more alkylene glycol structures;

(B2') a bifunctional (meth) acrylate monomer having no cyclic skeleton and having a monoalkylene glycol structure; and (C) a photopolymerization initiator.

In the curable composition for inkjet printing of the present invention, the amount of the (meth) acrylate monomer having a cyclic skeleton and having a number of alkylene oxide modifications of one or more and six or less (A') is 5 parts by mass or more and 40 parts by mass or less per 100 parts by mass of the curable composition.

Moreover, the mass ratio of the (meth) acrylate monomer having a cyclic skeleton and having a number of alkylene oxide modifications of one or more and six or less (A') to the total amount of the bifunctional (meth)acrylate monomer having no cyclic skeleton and having two or more alkylene glycol structures (B1') and the bifunctional (meth) acrylate monomer having no cyclic skeleton and having a monoalkylene glycol structure (B2') ((A')/(B1')+(B2')) is preferably 0.10 or more and 0.70 or less.

In addition, the mass ratio of the bifunctional (meth) acrylate monomer having no cyclic skeleton and having two or more alkylene glycol structures (B1') to the bifunctional (meth)acrylate monomer having no cyclic skeleton and having a monoalkylene glycol structure (B2') ((B1')/(B2')) is preferably 1.0 or more and 3.0 or less.

The above object of the present invention is also achieved by a cured product of the curable composition of the present invention and an electronic component having the cured product.

Effects of Invention

According to the invention, a coating film (a cured product) formed from the curable composition for inkjet printing does not produce cracks even after repetitive heating that corresponds to reflow soldering, and, even after soldering treatment and plating treatment, maintains sufficient adhesion to a substrate (solder heat resistance, plating resistance) and coating film hardness, and thus has good mechanical properties expected as a solder resist.

BRIEF DESCRIPTION OF DRAWING

FIG. 1 is a graph showing the conditions of reflow treatment on cured products (test substrates) of curable compositions according to Examples A and B of the present invention.

MODE FOR CARRYING OUT THE INVENTION

<Curable Composition for Inkjet Printing>

The curable composition for inkjet printing of the present invention (hereafter sometimes referred to as a "curable composition") contains:

(A) a photopolymerizable monomer having a cyclic skeleton and a shrinkage of less than 10%;

(B) a photopolymerizable bifunctional monomer having a viscosity at 25° C. of 100 mPa·s or less and a shrinkage of 10% or more and 20% or less; and (C) a photopolymerization initiator.

Also, the curable composition for inkjet printing of the present invention contains:

(A') a (meth)acrylate monomer having a cyclic skeleton and having a number of alkylene oxide modifications of one or more and six or less;

(B1') a bifunctional (meth)acrylate monomer having no cyclic skeleton and having two or more alkylene glycol structures;

(B2') a bifunctional (meth)acrylate monomer having no cyclic skeleton and having a monoalkylene glycol structure, and (C) a photopolymerization initiator.

[(A) Photopolymerizable Monomer having a Cyclic Skeleton and having a Shrinkage of Less than 10%]

The photopolymerizable monomer having a cyclic skeleton and having a shrinkage of less than 10% (A) is a monomer that is polymerizable by photo irradiation in the presence of the photopolymerization initiator (C). Due to the properties of having a shrinkage of less than 10% and a cyclic skeleton, good crack resistance upon reflowing, and adhesion to a conductor and film hardness even after a thermal history corresponding to soldering and after plating treatment, and film hardness of a formed coating film are maintained, and accordingly the monomer is considered as a monomer that imparts solder resist functionality.

To have photopolymerizability, the monomer has at least one ethylenically unsaturated group. The ethylenically unsaturated group is a substituent having an ethylenically unsaturated bond, such as a vinyl group and a (meth)acryloyl group, and is preferably a (meth)acryloyl group from the reactivity viewpoint. Here, the (meth)acryloyl group is a term collectively referring to an acryloyl group and a methacryloyl group.

The cyclic skeleton includes a cyclic carbon skeleton in which the ring structure is formed solely of carbon and a heterocyclic skeleton containing an atom other than carbon atoms such as an oxygen atom, a nitrogen atom, and a sulfur atom within the ring structure. Moreover, the ring structure may be an aromatic ring or a saturated or unsaturated ring structure.

Examples of photopolymerizable monomers having an aromatic ring and a shrinkage of less than 10% include (meth)acrylates of polyphenols and alkylene oxide adducts thereof.

Examples of polyphenols include bisphenols such as bisphenol A, bisphenol AP, bisphenol B, bisphenol BP, bisphenol E, bisphenol F, bisphenol M, bisphenol P, bisphenol PH and Bisphenol Z, and biphenols.

Examples of photopolymerizable monomers having a saturated or unsaturated ring structure and a shrinkage of less than 10% include hydrogenates of (meth) acrylates of the above polyphenol as well as di (meth) acrylates of diols having a carbocycle, such as tricyclodecanedimethanol di(meth)acrylate and cyclohexyl diacrylate, and alkylene oxide adducts thereof.

Examples of alkylene oxides include ethylene oxide, propylene oxide, and butylene oxide. However, since the shrinkage is increased as the number of alkylene oxides added is increased, the number of alkylene oxides added is preferably 6 or less when alkylene oxides are added.

The photopolymerizable monomer having a cyclic skeleton and a shrinkage of less than 10% (A) may be a polyfunctional (meth)acryloyl group-containing monomer (a polyfunctional (meth)acrylate) or a monofunctional (meth)acryloyl group-containing monomer (a monofunctional (meth)acrylate) or may be a mixture of a monofunctional (meth)acryloyl group-containing monomer (a monofunctional (meth)acrylate) and a polyfunctional (meth) acryloyl group-containing monomer, and from the viewpoint of keeping the viscosity of the composition low, the number of photopolymerizable substituents (ethylenically unsaturated groups) within the molecule is preferably two or less.

The photopolymerizable monomer having a cyclic skeleton and having a shrinkage of less than 10% (A) may have a cyclic (thio)ether group that is included in thermosetting components described below. In this case, thermal curing in addition to photocuring can further increase the adhesion to a conductor or a substrate and the heat resistance of an obtained coating film (a cured product).

The photopolymerizable monomer having a cyclic skeleton and a shrinkage of less than 10% (A), from the viewpoint of maintaining crack resistance upon reflowing and adhesion to a conductor and film hardness of a formed coating film even after a thermal history corresponding to soldering, is preferably 5 parts by mass or more and more preferably 10 parts by mass or more per 100 parts by mass of the curable composition of the present invention.

From the viewpoint of configuring the viscosity of the entirety of the composition to be suitable for an inkjet method, the photopolymerizable monomer (A) is preferably 50 parts by mass or less and more preferably 40 parts by mass or less per 100 parts by mass of the curable composition of the present invention.

Examples of commercially available products include ABE-300 (manufactured by SHIN-NAKAMURA CHEMICAL Co., Ltd.), BPE-80N (manufactured by SHIN-NAKAMURA CHEMICAL Co., Ltd.), BPE-100 (manufactured by SHIN-NAKAMURA CHEMICAL Co., Ltd.), BPE-4 (manufactured by DKS Co., Ltd.), BPE-10 (manufactured by DKS Co., Ltd.), BPE-200 (manufactured by SHIN-NAKAMURA CHEMICAL Co., Ltd.), HBPE-4 (manufactured by DKS Co., Ltd.), PHE (manufactured by DKS Co., Ltd.), PHE-2D (manufactured by DKS Co., Ltd.), NP-4

(manufactured by DKS Co., Ltd.), TEICA (manufactured by DKS Co., Ltd.), Aronix M-208 (manufactured by TOAGOSEI CO., LTD.), EA-1010LC (manufactured by SHIN-NAKAMURA CHEMICAL Co., Ltd.), IBOA-B (manufactured by DAICEL-ALLNEX LTD.), EBECRYL 110 (manufactured by DAICEL-ALLNEX LTD.), EBECRYL 150 (manufactured by DAICEL-ALLNEX LTD.), IRR 214-K (manufactured by DAICEL-ALLNEX LTD.), and EBECRYL 130 (manufactured by DAICEL-ALLNEX LTD.).

[(A') (Meth)Acrylate Monomer having a Cyclic Skeleton and having a Number of Alkylene Oxide Modifications of one or More and Six or Less]

The (meth)acrylate monomer having a cyclic skeleton and having a number of alkylene oxide modifications of one or more and six or less (A') is a monomer that, although it has a relatively high viscosity, increases the crack resistance after repetitive reflowing and the solder heat resistance of a coating film obtained by adding the monomer.

The cyclic skeleton includes a cyclic carbon skeleton in which the ring structure is formed solely of carbon and a heterocyclic skeleton containing an atom other than carbon atoms such as an oxygen atom, a nitrogen atom, and a sulfur atom within the ring structure. Moreover, the ring structure may be an aromatic ring or a saturated or unsaturated ring structure.

Examples of (meth)acrylate monomers having an aromatic ring and a number of alkylene oxide modifications of one or more and six or less include EO adducts and PO adducts of polyphenol acrylates.

Examples of polyphenols include bisphenols such as bisphenol A, bisphenol AP, bisphenol B, bisphenol BP, bisphenol E, bisphenol F, bisphenol M, bisphenol P, bisphenol PH and Bisphenol Z, and biphenols.

Examples of (meth)acrylate monomers having a saturated or unsaturated ring structure and a number of alkylene oxide modifications of one or more and six or less include hydrogenates of acrylates of the above polyphenols as well as alkylene oxide adducts of diacrylates of diols having a carbocycle, such as tricyclodecanedimethanol diacrylate and cyclohexyl diacrylate.

Examples of alkylene oxides include ethylene oxide, propylene oxide, and butylene oxide, and the (meth)acrylate monomer is preferably modified with at least one of ethylene oxide and propylene oxide, and is most preferably modified with ethylene oxide.

When the number of alkylene oxide modifications is one or more and six or less, an obtained coating film has good crack resistance and solder heat resistance. The number of alkylene oxide modifications is the number of alkylene oxide modifications within one monomer molecule and, specifically, is the total number n of —R—O— (R is an alkylene group) within one monomer molecule.

The number of alkylene oxide modifications is preferably one or more and four or less.

The (meth) acrylate monomer having a cyclic skeleton and having a number of alkylene oxide modifications of one or more and six or less (A') may be a polyfunctional (meth)acryloyl group-containing monomer (a polyfunctional (meth) acrylate) or a monofunctional (meth) acryloyl group-containing monomer (a monofunctional (meth) acrylate), and, from the viewpoint of keeping the viscosity of the composition low and the viewpoint of the heat resistance of a cured coating film, is preferably a bifunctional (meth) acryloyl group-containing monomer (a bifunctional (meth) acrylate). The (meth) acryloyl group is a term collectively referring to an acryloyl group and a methacryloyl group.

The (meth) acrylate monomer having a cyclic skeleton and having a number of alkylene oxide modifications of one or more and six or less (A') is preferably blended in an amount of 5 parts by mass or more and 40 parts by mass or less per 100 parts by mass of the curable composition. This concentration range makes it easy to configure the viscosity of the curable composition to be within a range usable in an inkjet method, and increases the reflow crack resistance and the solder heat resistance of an obtained coating film. The (meth) acrylate monomer (A') is preferably blended in an amount of 5 parts by mass or more and 30 parts by mass or less and more preferably in an amount of 10 parts by mass or more and 30 parts by mass or less per 100 parts by mass of the curable composition.

Examples of commercially available products include ABE-300 (manufactured by SHIN-NAKAMURA CHEMICAL Co., Ltd.), BPE-80N (manufactured by SHIN-NAKAMURA CHEMICAL Co., Ltd.), BPE-100 (manufactured by SHIN-NAKAMURA CHEMICAL Co., Ltd.), BPE-4 (manufactured by DKS Co., Ltd.), BPE-200 (manufactured by SHIN-NAKAMURA CHEMICAL Co., Ltd.), HBPE-4 (manufactured by DKS Co., Ltd.), and Aronix M-208 (manufactured by TOAGOSEI CO., LTD.).

[(B) Photopolymerizable Bifunctional Monomer having a Viscosity at 25° C. of 100 mPa·s or Less and a Shrinkage of 10% or More and 20% or less]

The photopolymerizable bifunctional monomer having a viscosity at 25° C. of 100 mPa·s or less and a shrinkage of 10% or more and 20% or less (B) is, among monomers that are polymerized by light, a diluent added to lower the viscosity of the curable composition, as specified as having a viscosity at 25° C. of 100 mPa·s or less.

Such diluents often have a high shrinkage, and thus by specifying the upper limit of the shrinkage to be 20% or less, the reflow crack properties and the solder heat resistance of an obtained cured product is increased. The shrinkage is more preferably 15% or less.

There is more contribution to lowering the shrinkage when the number of ethylenically unsaturated groups that ensure photopolymerizability is one within the molecule, but since the required level of solder heat resistance cannot be obtained when the monomer is monofunctional, the number is limited to two (bifunctional).

From the viewpoint of suitability as a diluent, the shrinkage of the photopolymerizable bifunctional monomer is 10% or more.

In the present invention, an example of the photopolymerizable bifunctional monomer having a viscosity at 25° C. of 100 mPa·s or less and a shrinkage of 10% or more and 20% or less is a bifunctional (meth)acryloyl group-containing monomer that is an ester of alkylene glycol and (meth) acrylic acid.

The alkylene glycol may be a monoalkylene glycol or one that has two or more alkylene glycol repeating structures.

Examples of the monoalkylene glycol include linear or branched alkylene diols having 3 to 16 carbon atoms and preferably 6 to 9 carbon atoms.

Examples of those having two or more alkylene glycol repeating structures include diethylene glycol, dipropylene glycol, dibutylene glycol, triethylene glycol, tripropylene glycol, and tributylene glycol.

Specifically, examples of the photopolymerizable bifunctional monomer having a viscosity at 25° C. of 100 mPa·s or less and a shrinkage of 10% or more and 20% or less (B) include diethylene glycol di(meth)acrylate, dipropylene glycol di (meth) acrylate, dibutylene glycol di (meth) acrylate, triethylene glycol di(meth)acrylate, tripropylene glycol di(meth)acrylate, tributylene glycol di(meth)acrylate, 1,3-butylene glycol di(meth)acrylate, 1,4-butanediol di(meth)acrylate, 1,6-hexanediol di(meth)acrylate, 1,9-nonanediol acrylate, 1,10-decanediol diacrylate, and 1,16-hexadecanediol diacrylate.

Examples of commercially available products include 2G (manufactured by SHIN-NAKAMURA CHEMICAL Co., Ltd.), 3G (manufactured by SHIN-NAKAMURA CHEMICAL Co., Ltd.), DPGDA (manufactured by TOYO CHEMICALS CO., LTD.), T0948 (manufactured by Tokyo Chemical Industry Co., Ltd.), T2389 (manufactured by Tokyo Chemical Industry Co., Ltd.), Viscoat #310HP (manufactured by Osaka Organic Chemical Industry Ltd.), PE-200 (manufactured by DKS Co., Ltd.), PE-300 (manufactured by DKS Co., Ltd.), HDDA (manufactured by DKS Co., Ltd.), L-C9A (manufactured by DKS Co., Ltd.), A-NOD-N (manufactured by SHIN-NAKAMURA CHEMICAL Co., Ltd.), and B1065 (manufactured by Tokyo Chemical Industry Co., Ltd.).

The photopolymerizable bifunctional monomer having a viscosity at 25° C. of 100 mPa·s or less and a shrinkage of 10% or more and 20% or less (B), from the viewpoint of maintaining the viscosity usable in an inkjet method, is preferably blended in an amount of 30 parts by mass or more, and more preferably 40 parts by mass or more, per 100 parts by mass of the curable composition.

The curable composition of the present invention preferably contains (B1) a photopolymerizable bifunctional monomer having a viscosity at 25° C. of 100 mPa·s or less and a shrinkage of 10% or more and 15% or less, as the photopolymerizable bifunctional monomer having a viscosity at 25° C. of 100 mPa·s or less and a shrinkage in the range of 10% or more and 20% or less (B), from the viewpoint of increasing the reflow crack resistance and the solder heat resistance of an obtained cured product.

An example of the photopolymerizable bifunctional monomer having a viscosity at 25° C. of 100 mPa·s or less and a shrinkage in the range of 10% or more and 15% or less (B1) is a bifunctional (meth)acryloyl group-containing monomer that is an ester of di- or trialkylene glycol and (meth)acrylic acid.

Examples of the dialkylene glycol include diethylene glycol, dipropylene glycol, and dibutylene glycol, examples of the trialkylene glycol include triethylene glycol, tripropylene glycol, and tributylene glycol, and specific examples and product names of the photopolymerizable bifunctional monomer having a viscosity at 25° C. of 100 mPa·s or less and a shrinkage in the range of 10% or more and 15% or less (B1) are as already described above.

The photopolymerizable bifunctional monomer having a viscosity at 25° C. of 100 mPa·s or less and a shrinkage in the range of 10% or more and 15% or less (B1) is preferably contained in an amount of 10 parts by mass or more and 60 parts by mass or less per 100 parts by mass of the curable composition of the present invention.

[(B1') Bifunctional (Meth) Acrylate Monomer having no Cyclic Skeleton and having Two or More Alkylene Glycol Structures]

The bifunctional (meth) acrylate monomer having no cyclic skeleton and having two or more alkylene glycol structures (B1'), among diluents added to lower the viscosity of the curable composition, increases the crack resistance upon reflowing of a coating film obtained by adding the monomer. That is, this bifunctional (meth) acrylate monomer, by being combined with the (meth) acrylate monomer having a cyclic skeleton and having a number of alkylene oxide modifications of one or more and six or less (A') and a bifunctional (meth) acrylate monomer having no cyclic skeleton and having a monoalkylene glycol structure (B2') described below, increases the crack resistance upon reflowing and the solder heat resistance of an obtained coating film while maintaining the fluidity usable in an inkjet method.

In the present invention, the bifunctional (meth) acrylate monomer having no cyclic skeleton and having two or more alkylene glycol structures (B1') is, for example, a bifunctional (meth)acryloyl group-containing monomer (a bifunctional (meth)acrylate) that is an ester of di- or trialkylene glycol and (meth)acrylic acid.

Examples of the dialkylene glycol include diethylene glycol, dipropylene glycol, and dibutylene glycol, and examples of the trialkylene glycol include triethylene glycol, tripropylene glycol, and tributylene glycol.

From the viewpoint of suppressing the viscosity to a viscosity suitable for an inkjet method, an ester of dialkylene glycol and (meth)acrylic acid is preferable.

Specific examples of the bifunctional (meth)acrylate monomer having neither an aromatic ring nor a saturated or unsaturated carbocycle and having a di- or trialkylene glycol structure (D1') include diethylene glycol di(meth)acrylate, dipropylene glycol di(meth)acrylate, dibutylene glycol di(meth)acrylate, triethylene glycol di(meth)acrylate, tripropylene glycol di(meth)acrylate, and tributylene glycol di(meth)acrylate.

Examples of commercially available products include 2G (manufactured by SHIN-NAKAMURA CHEMICAL Co., Ltd.), 3G (manufactured by SHIN-NAKAMURA CHEMICAL Co., Ltd.), DPGDA (manufactured by TOYO CHEMICALS CO., LTD.), T0948 (manufactured by Tokyo Chemical Industry Co., Ltd.), T2389 (manufactured by Tokyo Chemical Industry Co., Ltd.), and Viscoat #310HP (manufactured by Osaka Organic Chemical Industry Ltd.).

The bifunctional (meth) acrylate monomer having no cyclic skeleton and having two or more alkylene glycol structures (B1') is preferably blended in an amount of 20 parts by mass or more and 50 parts by mass or less per 100 parts by mass of the curable composition.

[(B2') Bifunctional (Meth) Acrylate Monomer having no Cyclic Skeleton and having a Monoalkylene Glycol Structure]

The bifunctional (meth) acrylate monomer having no cyclic skeleton and having a monoalkylene glycol structure (B2'), among diluents added to lower the viscosity of the curable composition, increases the solder heat resistance of a coating film obtained by adding the monomer. That is, this bifunctional (meth)acrylate monomer, by being combined with the (meth)acrylate monomer having a cyclic skeleton and having a number of alkylene oxide modifications of one or more and six or less (A') and the bifunctional (meth) acrylate monomer having no cyclic skeleton and having two or more alkylene glycol structures (B1'), increases the crack resistance upon reflowing and the solder heat resistance of an obtained coating film while maintaining the fluidity usable in an inkjet method.

In the present invention, the bifunctional (meth) acrylate monomer having no cyclic skeleton and having a monoalkylene glycol structure (B2') is, for example, a bifunctional (meth)acrylate monomer that is an ester of monoalkylene glycol and (meth)acrylic acid.

The monoalkylene glycol structure moiety is preferably a linear or branched alkylene chain having 3 to 16 carbon atoms within one molecule, and is particularly preferably a linear alkylene chain having 6 to 9 carbon atoms.

Specific examples of the bifunctional (meth)acrylate monomer having neither an aromatic ring nor a saturated or unsaturated carbocycle and having a monoalkylene glycol structure (B2') include 1,3-butylene glycol di(meth)acrylate, 1,4-butanediol di(meth)acrylate, 1,6-hexanediol di(meth)acrylate, 1,9-nonanediol acrylate, 1,10-decanediol diacrylate, and 1,16-hexadecanediol diacrylate.

Examples of commercially available products include HDDA (manufactured by DKS Co., Ltd.), A-NOD-N (manufactured by SHIN-NAKAMURA CHEMICAL Co., Ltd.), B1065 (manufactured by Tokyo Chemical Industry Co., Ltd.), Viscoat #195 (manufactured by Osaka Organic Chemical Industry Ltd.), and A-DOD-N (manufactured by SHIN-NAKAMURA CHEMICAL Co., Ltd.).

The bifunctional (meth) acrylate monomer having no cyclic skeleton and having a monoalkylene glycol structure (B2') is preferably blended in an amount of 10 parts by mass or more and 30 parts by mass or less per 100 parts by mass of the curable composition.

The mass ratio of the bifunctional (meth) acrylate monomer having no cyclic skeleton and having two or more alkylene glycol structures (B1') to the bifunctional (meth) acrylate monomer having no cyclic skeleton and having a monoalkylene glycol structure (B2') is preferably 1.0 or more and 3.0 or less.

With the mass ratio of these components being in the above range, an increase of the reflow crack resistance and the solder heat resistance of an obtained coating film can be achieved at a higher level, in combination with the (meth) acrylate monomer having a cyclic skeleton and having a number of alkylene oxide modifications of one or more and six or less (A').

Moreover, the mass ratio of the (meth) acrylate monomer having a cyclic skeleton and having a number of alkylene oxide modifications of one or more and six or less (A') to the total amount of the bifunctional (meth) acrylate monomer having no cyclic skeleton and having two or more alkylene glycol structures (B1') and the bifunctional (meth) acrylate monomer having no cyclic skeleton and having a monoalkylene glycol structure (B2') is preferably 0.10 or more and 0.70 or less.

With the mass ratio of the three components being in the above range, the reflow crack resistance and the solder heat resistance of an obtained coating film can be achieved at a higher level.

Moreover, the (meth)acrylate monomer having a cyclic skeleton and having a number of alkylene oxide modifications of one or more and six or less (A'), the bifunctional (meth) acrylate monomer having no cyclic skeleton and having two or more alkylene glycol structures (B1'), and the bifunctional (meth)acrylate monomer having no cyclic skeleton and having a monoalkylene glycol structure (B2') may contain or may not contain a hydroxyl group within the molecule.

The curable composition used in the present invention further contains the following photopolymerization initiator.

[(C) Photopolymerization Initiator]

The photopolymerization initiator (C) is not particularly limited as long as it can polymerize (meth) acrylate by energy ray irradiation, and a radical polymerization initiator is usable.

Any radical photopolymerization initiator is usable as long as it is a compound that produces a radical due to light, a laser, an electron beam, or the like and initiates a radical polymerization reaction. Examples of the radical photopolymerization initiator include benzoin and benzoin alkyl ethers such as benzoin, benzoin methyl ether, benzoin ethyl ether, and benzoin isopropyl ether; acetophenones such as acetophenone, 2,2-dimethoxy-2-phenylacetophenone, 2,2-diethoxy-2-phenylacetophenone, and 1,1-dichloroacetophenone; aminoacetophenones such as 2-methyl-1-[4-(methylthio)phenyl]-2-morpholinopropan-1-one, 2-benzyl-2-dimethylamino-1-(4-morpholinophenyl)-butan-1-one, and N,N-dimethylaminoacetophenone; anthraquinones such as 2-methylanthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; a 2,4,5-triarylimidazole dimer; riboflavin tetrabutyrate; thiol compounds such as 2-mercaptobenzimidazole, 2-mercaptobenzoxazole, and 2-mercaptobenzothiazole; organohalogen compounds such as 2,2,2-tribromoethanol, and tribromomethyl phenyl sulfone; benzophenones such as benzophenone and 4,4'-bisdiethylaminobenzophenone, or xanthones; and 2,4,6-trimethylbenzoyldiphenylphosphine oxide.

One of the above radical photopolymerization initiators can be used singly, or a plurality of the above radical photopolymerization initiators can be used as a mixture. In addition to these, photoinitiator aids such as tertiary amines such as N,N-dimethylaminobenzoic acid ethyl ester, N,N-dimethylaminobenzoic acid isoamyl ester, pentyl-4-dimethylaminobenzoate, triethylamine, and triethanolamine are usable. Titanocene compounds and the like such as CGI-784 (manufactured by BASF Japan) having absorption in the visible light region can also be added to a radical photopolymerization initiator to promote a photoreaction. Components added to the radical photopolymerization initiator are not limited thereto, and one or a plurality of components can be used without being limited to photopolymerization initiators and photoinitiator aids as long as they absorb light in the ultraviolet light or visible light region and cause an ethylenically unsaturated group such as a (meth)acryloyl group to be radically polymerized.

The amount of the photopolymerization initiator blended is 0.5 to 15 parts by mass, more preferably 0.5 to 10 parts by mass, and even more preferably 1 to 10 parts by mass per 100 parts by mass of the curable composition.

Examples of the product names of commercially available photopolymerization initiators include Omnirad 907, Omnirad 127, Omnirad 379 (all manufactured by IGM Resins), and 2-isopropylthioxanthone (manufactured by Nippon Kayaku Co., Ltd.).

The curable composition of the present invention preferably contains a thermosetting component. By containing a thermosetting component, the adhesion of an obtained coating film after soldering treatment or plating treatment (solder heat resistance and plating resistance) and the heat resistance such as crack suppression after heating can be increased.

Examples of the thermosetting component include known thermosetting resins such as amino resins such as melamine resins, benzoguanamine resins, melamine derivatives, and benzoguanamine derivatives, block isocyanate compounds, cyclocarbonate compounds, thermosetting components having a cyclic (thio)ether group, bismaleimide, and carbodiimide resins. In particular, having excellent storage stability, a block isocyanate compound is preferably used.

The thermosetting component having a plurality of cyclic (thio) ether groups within the molecule is a compound having a plurality of any one or two of three-, four-, or five-membered cyclic (thio) ether groups within the molecule, and examples include a compound having a plurality of epoxy groups within the molecule, i.e., a polyfunctional epoxy compound, a compound having a plurality of oxetanyl groups within the molecule, i.e., apolyfunctional oxetane compound, and a compound having a plurality of thioether groups within the molecule, i.e., an episulfide resin.

Examples of the polyfunctional epoxy compound include, but are not limited to, epoxidized vegetable oils such as Adeka Cizer O-130P and Adeka Cizer O-180A manufactured by ADEKA Corporation; bisphenol A epoxy resins such as jER 828 manufactured by Mitsubishi Chemical Corporation, EHPE3150 manufactured by Daicel Chemical Industries, Ltd., Epicron 840 manufactured by DIC Corporation, Epotohto YD-011 manufactured by Tohto Kasei Co., Ltd., D.E.R. 317 manufactured by Dow Chemical Company, Sumi-Epoxy ESA-011 manufactured by Sumitomo Chemical Industry Company Limited, and A.E.R. 330 manufactured by Asahi Kasei Corporation (all trade names); hydroquinone epoxy resins, bisphenol F epoxy resins such as YSLV-80XY manufactured by NIPPON STEEL Chemical & Material CO., LTD., and thioether epoxy resins such as YSLV-120TE manufactured by NIPPON STEEL Chemical & Material CO., LTD.; brominated epoxy resins such as jER YL 903 manufactured by Mitsubishi Chemical Corporation, Epiclon 152 manufactured by DIC Corporation, Epotohto YDB-400 manufactured by Tohto Kasei Co., Ltd., D.E.R. 542 manufactured by Dow Chemical Company, Sumi-Epoxy ESB-400 manufactured by Sumitomo Chemical Industry Company Limited, and A.E.R. 711 manufactured by Asahi Kasei Corporation (all trade names); novolak epoxy resins such as jER 152 manufactured by Mitsubishi Chemical Corporation, D.E.N. 431 manufactured by Dow Chemical Company, Epiclon N-730 manufactured by DIC Corporation, Epotohto YDCN-701 manufactured by Tohto Kasei Co., Ltd., EPPN-201 manufactured by Nippon Kayaku Co., Ltd., Sumi-Epoxy ESCN-195X manufactured by Sumitomo Chemical Industry Company Limited, and A.E.R. ECN-235 manufactured by Asahi Kasei Corporation (all trade names); biphenol novolak epoxy resins such as NC-3000 manufactured by Nippon Kayaku Co., Ltd.; bisphenol F epoxy resins such as Epiclon 830 manufactured by DIC Corporation, jER 807 manufactured by Mitsubishi Chemical Corporation, and Epotohto YDF-170, YDF-175, and YDF-2004 manufactured by Tohto Kasei Co., Ltd. (all trade names); hydrogenated bisphenol A epoxy resins such as Epotohto ST-2004 (trade name) manufactured by Tohto Kasei Co., Ltd.; glycidylamine epoxy resins such as jER 604 manufactured by Mitsubishi Chemical Corporation, Epotohto YH-434 manufactured by Tohto Kasei Co., Ltd., and Sumi-Epoxy ELM-120 manufactured by Sumitomo Chemical Industry Company Limited. (all trade names); hydantoin epoxy resins; alicyclic epoxy resins such as Celloxide 2021 manufactured by Daicel Chemical Industries, Ltd. (trade name); trihydroxyphenyl methane epoxy resins such as EPPN-501 manufactured by Nippon Kayaku Co., Ltd. (trade name); bixylenol or biphenol epoxy resins such as YL-6056, YX-4000, YL-6121 manufactured by Mitsubishi Chemical Corporation (all trade names) or mixtures thereof; bisphenol S epoxy resins such as EBPS-200 manufactured by Nippon Kayaku Co., Ltd., EPX-30 manufactured by ADEKA Corporation, and EXA-1514 manufactured by DIC Corporation (trade names); bisphenol A novolak epoxy resins such as jER 157S (trade name) manufactured by Mitsubishi Chemical Corporation; tetraphenylol ethane epoxy resins such as jER YL-931 manufactured by Mitsubishi Chemical Corporation (trade name); heterocyclic epoxy resins such as TEPIC manufactured by Nissan Chemical Industries, Ltd. (trade name); diglycidyl phthalate resins such as BLEMMER DGT manufactured by NOF CORPORATION; tetraglycidylxylenoylethane resins such as ZX-1063 manufactured by Tohto Kasei Co., Ltd.; naphthalene group-containing epoxy resins such as ESN-190 manufactured by NIPPON STEEL Chemical and HP-4032 manufactured by DIC Corporation; epoxy resins having a dicyclopentadiene skeleton such as HP-7200 manufactured by DIC Corporation; glycidyl methacrylate copolymer-based epoxy resins such as CP-505 and CP-50M manufactured by NOF CORPORATION; moreover, copolymer epoxy resins of cyclohexyl maleimide and glycidyl methacrylate; and epoxy-modified polybutadiene rubber derivatives (such as PB-3600 manufactured by Daicel Chemical Industries, Ltd.) and CTBN-modified epoxy resins (such as YR-102 and YR-450 manufactured by Tohto Kasei Co., Ltd.). These epoxy resins can be used singly or in combinations of two or more. Among these, in particular, novolac epoxy resins, bixylenol epoxy resins, biphenol epoxy resins, biphenol novolac epoxy resins, naphthalene epoxy resins, or mixtures thereof are preferable.

Examples of the polyfunctional oxetane compound include polyfunctional oxetanes such as bis[(3-methyl-3-oxetanylmethoxy)methyl] ether, bis[(3-ethyl-3-oxetanylmethoxy)methyl] ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, oligomers or copolymers thereof, and etherified products between oxetane alcohol and a resin having a hydroxyl group such as a novolac resin, poly(p-hydroxystyrene), cardo bisphenol, calixarene, calixresorcinarene, or silsesquioxane. Another example is a copolymer of an unsaturated monomer having an oxetane ring and alkyl (meth)acrylate.

A monomer having both a radically polymerizable moiety (a methacryl group) and a cationically polymerizable moiety (an oxetanyl moiety) within the molecule, such as (3-methyl-3-oxetanyl)methyl acrylate, (3-ethyl-3-oxetanyl) methyl acrylate, (3-methyl-3-oxetanyl)methyl methacrylate, or (3-ethyl-3-oxetanyl)methyl methacrylate, is a photocurable component as well as a thermosetting component, and is therefore preferably contained in the composition when performing two-step curing of photocuring and heat curing.

Examples of such components other than polyfunctional oxetane compounds include a (meth)acryloyl group-containing bisphenol A epoxy resin (product name, EA-1010LC, manufactured by SHIN-NAKAMURA CHEMICAL Co., Ltd.), 4-hydroxybutyl acrylate glycidyl ether (product name, 4HBAGE, manufactured by Nippon Kasei Co., Ltd.), and 3,4-epoxycyclohexylmethyl methacrylate (product name, Cyclomer M100, manufactured by Daicel Corporation).

An example of the compound having a plurality of cyclic thioether groups within the molecule is bisphenol A episulfide resin YL7000 manufactured by Mitsubishi Chemical Corporation. An episulfide resin, in which the oxygen atom of the epoxy group of a novolac epoxy resin is replaced with a sulfur atom by using the same synthesis method, or the like is also usable.

Examples of amino resins such as melamine derivatives and benzoguanamine derivatives include methylol melamine compounds, methylol benzoguanamine compounds, methylol glycoluril compounds, and methylolurea compounds. Moreover, alkoxymethylated melamine compounds, alkoxymethylated benzoguanamine compounds, alkoxymethylated glycoluril compounds, and alkoxymethylated urea compounds can be obtained by converting the methylol groups of methylol melamine compounds, methylol benzoguanamine compounds, methylol glycoluril compounds, and methylolurea compounds, respectively, into alkoxymethyl groups. The kind of this alkoxymethyl group is not particularly limited, and may be, for example, a methoxymethyl group, an ethoxymethyl group, a propoxymethyl group, a butoxymethyl group, or the like. In particular, a melamine derivative having a formalin concentration of 0.2% or less, which is physically and environmentally friendly, is preferable.

Examples of commercially available products thereof include Cymel 300, Cymel 301, Cymel 303, Cymel 370, Cymel 325, Cymel 327, Cymel 701, and Cymel 266 (all manufactured by Mitsui Cyanamid Ltd.), and Nikalac Mx-750, Nikalac Mx-032, Nikalac Mx-270, Nikalac Mx-280, Nikalac Mx-290, and Nikalac Mx-706 (all manufactured by SANWA Chemical Co., Ltd.). Such thermosetting components may be used singly or in combinations of two or more.

The isocyanate compound and the block isocyanate compound are compounds having a plurality of isocyanate groups or block isocyanate groups within one molecule. Examples of such compounds having a plurality of isocyanate groups or block isocyanate groups within one molecule include polyisocyanate compounds and block isocyanate compounds. The block isocyanate group is a group obtained by reacting an isocyanate group with a blocking agent to protect and temporarily inactivate it, and when the block isocyanate group is heated to a specific temperature, the blocking agent dissociates, and an isocyanate group is produced. By adding the polyisocyanate compound or the block isocyanate compound, curability, and the toughness of an obtained cured product, can be increased.

As such a polyisocyanate compound, for example, aromatic polyisocyanate, aliphatic polyisocyanate, or alicyclic polyisocyanate is used.

Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate, and 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexyl isocyanate), and isophorone diisocyanate.

Specific examples of the alicyclic polyisocyanate include bicycloheptane triisocyanate. In addition, examples include adducts, burettes, and isocyanurates of the isocyanate compounds listed above.

As a block isocyanate compound, a product of an addition reaction between an isocyanate compound and an isocyanate blocking agent is used. Examples of the isocyanate compound capable of reacting with the blocking agent include the polyisocyanate compounds described above.

Examples of the isocyanate blocking agent include phenol-based blocking agents such as phenol, cresol, xylenol, chlorophenol, and ethylphenol; lactam-based blocking agents such as ε-caprolactam, δ-valerolactam, γ-butyrolactam, and β-propiolactam; active methylene-based blocking agents such as ethyl acetoacetate and acetylacetone; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate, and ethyl lactate; oxime-based blocking agents such as formaldehyde oxime, acetaldoxime, acetoxime, methyl ethyl ketoxime, diacetyl monooxime, and cyclohexane oxime; mercaptan-based blocking agents such as butyl mercaptan, hexyl mercaptan, t-butyl mercaptan, thiophenol, methylthiophenol, and ethylthiophenol; acid amide-based blocking agents such as acetic acid amide and benzamide; imide-based blocking agents such as succinimide and maleic imide; amine-based blocking agents such as xylidine, aniline, butylamine, and dibutylamine; imidazole-based blocking agents such as imidazole and 2-ethylimidazole; imine-based blocking agents such as methyleneimine and propyleneimine; and pyrazole-based blocking agents.

The block isocyanate compound may be a commercially available product, and examples include Sumidur BL-3175, BL-4165, BL-1100, and BL-1265, Desmodur TPLS-2957, TPLS-2062, TPLS-2078, and TPLS-2117, and Desmotherm 2170 and Desmotherm 2265 (all manufactured by Sumitomo Bayer Urethane Co., Ltd.), Coronate 2512, Coronate 2513, and Coronate 2520 (all manufactured by Nippon Polyurethane Industry Co., Ltd.), B-830, B-815, B-846, B-870, B-874, and B-882 (all manufactured by Mitsui Takeda Chemicals Inc.), TPA-B80E, 17B-60PX, and E402-B8OT (all manufactured by Asahi Kasei Chemicals Corporation), and 7950, 7951, 7960, 7961, 7982, 7990, 7991, and 7992 (all manufactured by Baxenden Chemicals Ltd.). Sumidur BL-3175 and BL-4265 are obtained by using methyl ethyl oxime as a blocking agent. Such compounds having a plurality of isocyanate groups or block isocyanate groups within one molecule may be used singly or in combinations of two or more.

The amount of the thermosetting component blended is preferably 1 to 30 parts by mass per 100 parts by mass of the curable composition of the present invention. When the amount blended is 1 part by mass or more, the toughness and the heat resistance of a coating film are further increased. On the other hand, when 30 parts by mass or less, deterioration of storage stability can be suppressed.

Moreover, the curable composition of the present invention may contain a (meth)acrylate having a hydroxyl group. By containing a (meth)acrylate having a hydroxyl group, the adhesion of an obtained coating film to a conductor circuit metal and a plastic substrate is increased.

Examples of the (meth)acrylate having a hydroxyl group include 2-hydroxy-3-acryloyloxypropyl (meth) acrylate, 2-hydroxy-3-phenoxyethyl (meth) acrylate, 1,4-cyclohexanedimethanol mono(meth)acrylate, 2-hydroxyethyl (meth) acrylate, 2-hydroxypropyl (meth) acrylate, 4-hydroxybutyl (meth) acrylate, pentaerythritol tri(meth)acrylate, dipentaerythritol monohydroxy penta(meth)acrylate, and 2-hydroxypropyl (meth)acrylate. Examples of commercially available products include Aronix M-5700 (name of product manufactured by TOAGOSEI CO., LTD.), 4HBA, 2HEA, and CHDMMA (all names of products manufactured by Nihon Kasei Co., Ltd.), BHEA, HPA, HEMA, and HPMA (all names of products manufactured by NIPPON SHOKUBAI CO., LTD.), and LIGHT ESTER HO, LIGHT ESTER HOP, and LIGHT ESTER HOA (all names of products manufactured by Kyoeisha Chemical Co., Ltd.). One of or a combination of a plurality of (meth) acrylate compounds having a hydroxy group (B) can be used.

In particular, 2-hydroxy-3-acryloyloxypropyl acrylate, 2-hydroxy-3-phenoxyethyl acrylate, 2-hydroxyethyl acrylate, 2-hydroxypropyl acrylate, 4-hydroxybutyl acrylate, and 1,4-cyclohexanedimethanol monoacrylate are preferably used. From the viewpoint of the ease of viscosity adjustment, a monofunctional (meth) acrylate compound is preferably used.

The amount of the (meth) acrylate compound having a hydroxyl group blended is preferably 1 to 10 parts by mass and more preferably 1 to 5 parts by mass per 100 parts by mass of the curable composition of the present invention.

The curable composition of the present invention may further contain a multi-branched oligomer or a multi-branched polymer. In the present invention, the multi-branched oligomer or polymer having an ethylenically unsaturated group is a compound in which the multi-branched oligomer or polymer (which refers to an oligomer or polymer having a plurality of branched chains within one molecule) skeleton has at least one ethylenically unsaturated group. The ethylenically unsaturated group is derived from a functional group such as a (meth) acryloyl group and may have a plurality of ethylenically unsaturated groups within one molecule. The (meth) acryloyl group is a concept encompassing both an acryloyl group and a methacryloyl group.

The multi-branched oligomer and/or polymer having an ethylenically unsaturated group (hereinafter also simply referred to as a "multi-branched oligomer or polymer") is preferably a compound having a dendrimer structure (a dendritic structure) (hereinafter also simply referred to as a dendrimer), a compound having a hyperbranched structure (hereinafter also simply referred to as a hyperbranch (oligomer, polymer)), a compound (oligomer, polymer) having a star structure, and a compound (oligomer, polymer) having a graft structure, wherein the compound has a functional group having an ethylenically unsaturated bond, such as a (meth)acryloyl group.

The dendrimer in the present invention broadly refers to compounds having a structure in which branched chains radially spread. The specific kind of the dendrimer is not particularly limited, and one or more can be selected from known dendrimers such as amidoamine-based dendrimers, phenyl ether-based dendrimers, and hyperbranched polyethylene glycols.

The multi-branched oligomer or polymer generally has a weight average molecular weight (Mw) of 1000 to 20000 and preferably 1000 to 8000. The weight average molecular weight (Mw) is a molecular weight in terms of polystyrene based on a molecular weight distribution curve based on gel permeation chromatography measurement.

The number of functional groups having an ethylenically unsaturated bond within one molecule of the multi-branched oligomer or polymer of the present invention, and, in particular the number of (meth) acryloyl groups, is preferably 3 or more and, in particular, in the range of 4 to 30, and is selected from a range that does not cause the desired effect of the composition of the present invention to be impaired. In particular, since the photocurable composition of the present invention is used for inkjet, a multi-branched oligomer or polymer that has 30 or less functional groups and that results in a viscosity of 150 mPa·s or less at room temperature (25° C.) is used.

The method for producing the dendrimer is not particularly limited, and a known production method can be employed, such as a divergent method in which a molecule for each generation is bonded to a central core molecule to form a branch, a convergent method in which a branch moiety synthesized in advance is bonded to a core molecule, and a method of a one-step synthesis performed using a monomer ABx having within one molecule a branched moiety having two or more reaction points B and a connecting moiety having other reaction points A.

Commercially available dendrimers are usable, and examples include Etercure 6361-100 (manufactured by Eternal Materials Co., Ltd.), Doublermer (DM) 2015 (manufactured by Double Bond Chemical Ind. Co., Ltd.), SP1106 (manufactured by Miwon Specialty Chemical Co., Ltd.), and Viscoat #1000 (manufactured by Osaka Organic Chemical Industry Ltd.).

In addition, dendrimers are available from Iris Biotech, Kanto Chemical Co., Inc., Merk Millipore, QIAGEN, Sigma-Aldrich, Techno Chemical Corp., Double Bond Chamical Ind. Co., Ltd., Osaka Organic Chemical Industry Ltd., Hakuto Co., Ltd., and the like.

In the present invention, the use of a multi-branched oligomer or polymer having an ethylenically unsaturated group enables adhesion between the curable composition and a substrate to be increased and, moreover, increased hardness to be imparted to a cured product. Also, plating resistance under severe treatment conditions can be increased.

Moreover, since the multi-branched oligomer or polymer having an ethylenically unsaturated group provides a relatively low viscosity even when the number of functional groups or the amount of the oligomer or polymer used is increased, the oligomer or polymer is significant in order to impart increased hardness to the curable composition.

The amount of the multi-branched oligomer or polymer having an ethylenically unsaturated group blended is preferably 0.1 to 40% by mass based on the total mass of the curable composition. With the amount being 0.1 or more, the hardness of a coating film is increased, and with the amount being 40% by mass or less, a viscosity increase of the curable composition can be suppressed.

The curable composition of the present invention may contain a trifunctional to hexafunctional (meth)acrylate compound. With a trifunctional to hexafunctional (meth) acrylate compound being contained, enhancement of the tack properties (dryness to the touch) of the composition after being photocured is expected.

Examples of the trifunctional to hexafunctional (meth) acrylate compound include polyfunctional acrylates represented by trimethylolpropane triacrylate, trimethylolmethane triacrylate, ethylene oxide-modified trimethylolpropane triacrylate, propylene oxide-modified trimethylolpropane triacrylate, epichlorohydrin-modified trimethylolpropane triacrylate, pentaerythritol tetraacrylate, tetramethylolmethane tetraacrylate, ethylene oxide-modified phosphate triacrylate, propylene oxide-modified phosphate triacrylate, epichlorohydrin-modified glycerol triacrylate, dipentaerythritol hexaacrylate, ditrimethylolpropane tetraacrylate, or silsesquioxane-modified products thereof, or methacrylate monomers corresponding thereto, and ε-caprolactone-modified trisacryloxyethyl isocyanurate. The amount of the trifunctional to hexafunctional (meth) acrylate compound blended is, for example, 1 to 20 parts by mass and preferably 1 to 10 parts by mass per 100 parts by mass of the curable composition of the present invention.

Additives such as antifoaming/leveling agents, thixotropy imparting agents/thickeners, coupling agents, dispersants, and flame retardants can be contained in the curable composition of the present invention as necessary.

As antifoaming agents/leveling agents, usable are compounds such as silicone, modified silicone, mineral oil, vegetable oil, fatty alcohol, fatty acid, metal soap, fatty acid amide, polyoxyalkylene glycol, polyoxyalkylene alkyl ether, and polyoxyalkylene fatty acid ester.

As thixotropy imparting agents/thickeners, usable are viscous minerals such as kaolinite, smectite, montmorillonite, bentonite, talc, mica, and zeolite, fine particle silica, silica gel, amorphous inorganic particles, polyamide-based additives, modified urea-based additives, and wax-based additives.

By adding an antifoaming/leveling agent and a thixotropy imparting agent/thickener, the surface properties of a cured product and the properties of a composition can be regulated.

As coupling agents, usable are those in which the alkoxy group is a methoxy group, an ethoxy group, acetyl, or the like, and the reactive functional group is vinyl, methacryl, acryl, epoxy, cyclic epoxy, mercapto, amino, diamino, acid anhydride, ureido, sulfide, isocyanate, or the like, for example, silane coupling agents such as vinyl-based silane compounds such as vinyl ethoxysilane, vinyl trimethoxysilane, vinyl·tris β-methoxyethoxy) silane, and γ-methacryloxypropyltrimethoxylane, amino-based silane compounds such as γ-aminopropyltrimethoxysilane, N-β-(aminoethyl)-γ-aminopropyltrimethoxysilane, N-β-(aminoethyl)-γ-aminopropylmethyldimethoxysilane, and γ-ureidopropyltriethoxysilane, epoxy-based silane compounds such as γ-glycidoxypropyltrimethoxysilane, β-(3,4-epoxycyclohexyl)ethyltrimethoxylane, and γ-glycidoxypropylmethyldiethoxysilane, mercapto-based silane compounds such as γ-mercaptopropyltrimethoxysilane, and phenylamino-based silane compounds such as N-phenyl-γ-aminopropyltrimethoxysilane; titanate-based coupling agents such as isopropyl triisostearoylated titanate, tetraoctyl bis(ditridecyl phosphite) titanate, bis(dioctyl pyrophosphate) oxyacetate titanate, isopropyl tridodecylbenzenesulfonyl titanate, isopropyl tris(dioctyl pyrophosphate) titanate, tetraisopropyl bis(dioctyl phosphite) titanate, tetra(1,1-diallyloxymethyl-1-butyl) bis(ditridecyl) phosphite titanate, bis(dioctyl pyrophosphate) ethylene titanate, isopropyl trioctanoyl titanate, isopropyl dimethacryl isostearoyl titanate, isopropyl tristearoyl diacrylic titanate, isopropyl tri(dioctyl phosphate) titanate, isopropyl tricumyl phenyl titanate, dicumylphenyloxyacetate titanate, and diisostearoyl ethylene titanate; zirconate-based coupling agents such as ethylenically unsaturated zirconate-containing compounds, neoalkoxy zirconate-containing compounds, neoalkoxy trisneodecanoyl zirconate, neoalkoxy tris(dodecyl)benzenesulfonyl zirconate, neoalkoxy tris(dioctyl)phosphate zirconate, neoalkoxy tris(dioctyl)pyrophosphate zirconate, neoalkoxy tris(ethylenediamino)ethyl zirconate, neoalkoxy tris(m-amino)phenyl zirconate, tetra(2,2-diallyloxymethyl)butyl, di(ditridecyl)phosphite zirconate, neopentyl(diallyl)oxy, trineodecanoyl zirconate, neopentyl(diallyl)oxy, tri(dodecyl) benzene-sulfonyl zirconate, neopentyl(diallyl)oxy, tri(dioctyl)phosphato zirconate, neopentyl(diallyl)oxy, tri(dioctyl) pyro-phosphato zirconate, neopentyl(diallyl)oxy, tri(N-ethylenediamino)ethyl zirconate, neopentyl(diallyl)oxy, tri(m-amino)phenyl zirconate, neopentyl(diallyl)oxy, trimethacryl zirconate(, neopentyl(diallyl)oxy, triacryl zirconate, dineopentyl(diallyl)oxy, diparaaminobenzoyl zirconate, dineopentyl(diallyl)oxy, di(3-mercapto)propioniczirconate, zirconium (IV) 2,2-bis(2-propenolatomethyl) butanolato, cyclodi[2,2-(bis2-propenolatomethyl) butanolato]pyrophosph ato-O,O; and aluminate-based coupling agents such as diisobutyl(oleyl)acetoacetylaluminate and alkyl acetoacetate aluminum diisopropylate.

As dispersants, usable are high-molecular dispersants such as polycarboxylic acid-based, naphthalene sulfonic acid formalin condensation-based, polyethylene glycol, polycarboxylic acid partial alkyl ester-based, polyether-based, and polyalkylene polyamine-based dispersants, and low-molecular dispersants such as alkyl sulfonic acid-based, quaternary ammonium-based, higher alcohol alkylene oxide-based, polyhydric alcohol ester-based, and alkyl polyamine-based dispersants.

As flame retardants, usable are hydrated metal-based flame retardants such as aluminum hydroxide and magnesium hydroxide, red phosphorus, ammonium phosphate, ammonium carbonate, zinc borate, zinc stannate, molybdenum compound-based, bromine compound-based, chlorine compound-based, phosphoric acid ester, phosphorus-containing polyol, phosphorus-containing amine, melamine cyanurate, melamine compound, triazine compound, guanidine compound, silicone polymer flame retardants, and the like.

In order to regulate the polymerization rate and the degree of polymerization, it is further possible to add a polymerization inhibitor and a polymerization retarder.

Moreover, a solvent for viscosity regulation may be used in the curable composition of the present invention, but the amount of a solvent added is preferably as small as possible in order to prevent a reduced film thickness after curing. It is more preferable not to contain a solvent for viscosity regulation.

A coloring pigment, dye, and the like may be added to the curable composition of the present invention for coloration. Usable coloring pigments, dyes, and the like are those known and commonly used that are indicated by color indices. Examples include Pigment Blue 15, 15:1, 15:2, 15:3, 15:4, 15:6, 16, 60, Solvent Blue 35, 63, 68, 70, 83, 87, 94, 97, 122, 136, 67, 70, Pigment Green 7, 36, 3, 5, 20, 28, Solvent Yellow 163, Pigment Yellow 24, 108, 193, 147, 199, 202, 110, 109, 139 179 185 93, 94, 95, 128, 155, 166, 180, 120, 151, 154, 156, 175, 181, 1, 2, 3, 4, 5, 6, 9, 10, 12, 61, 62, 62:1, 65, 73, 74, 75, 97, 100, 104, 105, 111, 116, 167, 168, 169, 182, 183, 12, 13, 14, 16, 17, 55, 63, 81, 83, 87, 126, 127, 152, 170, 172, 174, 176, 188, 198, Pigment Orange 1, 5, 13, 14, 16, 17, 24, 34, 36, 38, 40, 43, 46, 49, 51, 61, 63, 64, 71, 73, Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, 269, 37, 38, 41, 48:1, 48:2, 48:3, 48:4, 49:1, 49:2, 50:1, 52:1, 52:2, 53:1, 53:2, 57:1, 58:4, 63:1, 63:2, 64:1, 68, 171, 175, 176, 185, 208, 123, 149, 166, 178, 179, 190, 194, 224, 254, 255, 264, 270, 272, 220, 144, 166, 214, 220, 221, 242, 168, 177, 216, 122, 202, 206, 207, 209, Solvent Red 135, 179, 149, 150, 52, 207, Pigment Violet 19, 23, 29, 32, 36, 38, 42, Solvent Violet 13, 36, Pigment Brown 23, 25, and Pigment Black 1, 7. These coloring pigments, dyes and the like are preferably added in an amount of 0.01 to 5 parts by mass per 100 parts by mass of the curable composition.

The curable composition of the present invention is applicable to printing by an inkjet method. In order to be applicable to printing by an inkjet method, the curable composition preferably has a viscosity such that the composition can be jetted by an inkjet printer.

Viscosity refers to viscosity measured according to JIS Z 8803. The viscosity of the curable composition for inkjet is preferably 150 mPa·s or less at normal temperature (25° C.). As described above, the viscosity of an ink used in an inkjet printer is preferably about 20 mPa·s or less at the temperature during application. However, with a viscosity of 150 mPa·s or less at normal temperature, the above conditions can be satisfied by heating before or during application.

Accordingly, with the curable composition of the present invention, a pattern can be directly printed onto a printed wiring board substrate or the like.

Moreover, the curable composition of the present invention does not undergo a polymerization reaction at normal temperature and, thus, can be stably stored as a one-component curable composition.

The curable composition of the present invention is fed as an ink to an inkjet printer and used in printing onto a substrate. Since the composition of the present invention has an extremely low ink viscosity, patterns and characters printed/applied onto a substrate by printing/application by an inkjet method result in wetting and spreading over a long period of time, causing blurring.

<Cured Product of Curable Composition>

A cured product of the curable composition of the present invention can be obtained by, for example, photocuring a composition layer immediately after being printed by irradiating the composition layer with 50 mJ/cm$^2$ to 1000 mJ/cm$^2$ of light. Light irradiation is performed by irradiation of active energy rays such as ultraviolet rays, electron beams, and actinic rays, and preferably ultraviolet rays.

Ultraviolet irradiation in an inkjet printer can be performed by, for example, attaching a light source such as a high-pressure mercury lamp, a metal halide lamp, or an ultraviolet LED to the side surface of a print head and performing scanning by moving the print head or a substrate. In this case, printing and ultraviolet irradiation can be performed almost simultaneously.

When containing a thermosetting component, the cured product after being photocured is thermally cured by using a known heating means, e.g., a heating oven such as a hot air oven, an electric oven, or an infrared induction heating oven. As for heating conditions, heating at 130° C. to 170° C. for 5 minutes to 90 minutes is preferable.

<Electronic Component in which Cured Product of Curable Composition is Used as Insulating Cured Coating Film>

A coating film (a cured product) composed of the curable composition that is pattern-printed onto a base material such as a substrate, when used as a solder resist, is heated in a soldering process for mounting a component. Soldering may be performed by any of manual soldering, flow soldering, reflow soldering, and the like, and, for example, in the case of reflow soldering, the coating film is subjected to a ref lowing process in which preheating at 100° C. to 140° C. for 1 to 4 hours and then heating at 240 to 280° C. for about 5 to 20 seconds are repeated a plurality of times (for example, 2 to 4 times) to heat and melt the solder, and after cooling, components are mounted as necessary, and an electronic component is completed.

In the present invention, the electronic component means a component for use in an electronic circuit, including in addition to active components such as printed wiring boards, transistors, light emitting diodes, and laser diodes, passive components such as resistors, capacitors, inductors, and connectors. A cured product of the curable composition of the present invention provides the effects of the present invention as an insulating cured coating film thereof.

When the substrate is a so-called rigid substrate, i.e., a double-sided board having wiring printed on both surfaces or a multilayer board obtained by laminating substrates, a substrate having a coating film composed of the above curable composition is subjected to the above soldering process a plurality of times to be repetitively heated.

With the curable composition of the present invention, an obtained coating film (a cured product) does not produce cracks in the coating film and maintains sufficient adhesion to a substrate and coating film hardness even after undergoing a thermal history corresponding to a plurality of times of soldering, and thus has good mechanical properties expected as a solder resist to be provided on a rigid substrate.

The curable composition of the present invention has excellent plasticity, impact resistance, adhesion, chemical resistance, heat resistance (including crack resistance and adhesion and hardness maintaining properties after heating), insulation, and the like, and is thus applicable to various applications, and the application target is not particularly limited. For example, it can be used in, for example, preparation of an etching resist, a solder resist, and a marking resist for printed wiring boards involving an inkjet method, and, in particular, can be suitably used as a solder resist that requires high heat resistance.

It is also usable in applications such as UV-molding materials, stereolithography materials, and 3D inkjet materials.

The present invention is not limited to the configurations of the above embodiments and the Examples, and various modifications can be made within the scope of the invention.

EXAMPLES

Below, the present invention will now be specifically described by way of the Examples, but the present invention is not limited solely to the Examples. A "part" means a "part by mass" unless otherwise specified below.

Example A

Examples A1 to 5 and Comparative Examples A1 to 3

1. Preparation of Compositions

Components were blended in the proportions (unit: parts by mass) shown in Table 1 and stirred by a dissolver. Thereafter, the mixtures were dispersed for 2 hours by a bead mill using 1 mm zirconia beads, and thus compositions of the present invention (Examples A1 to 5) and compositions not of the present invention (Comparative Examples A1 to 3) were obtained.

TABLE 1

| | Shrinkage | Example A1 | Example A2 | Example A3 | Example A4 | Example A5 | Comparative Example A1 | Comparative Example A2 | Comparative Example A3 |
|---|---|---|---|---|---|---|---|---|---|
| (A)EBECRYL 150 | 7.1% | 18 | 24 | 36 | | 10 | | 24 | |
| (A)HBPE-4 | 5.7% | | | | 24 | | | | |
| EBECRYL40 | 8.7% | | | | | | 24 | | |
| (B)HDDA | 19.0% | 22 | 22 | 10 | 22 | 46 | 22 | | 46 |
| (B1)DPGDA | 13.0% | 36 | 36 | 36 | 36 | 18 | 36 | | 36 |
| (B1)LC-9 | 11.8% | 6 | 6 | 6 | 6 | 6 | 6 | | 6 |
| EBECRYL11 | 9.5% | | | | | | | 64 | |
| (C) Omnirad 379 | | 3.6 | 3.6 | 3.6 | 3.6 | 6.0 | 3.6 | 3.6 | 3.6 |
| (C) ITX | | 0.3 | 0.3 | 0.3 | 0.3 | 0.9 | 0.3 | 0.3 | 0.3 |
| (C) Omnirad TPO | | 4.8 | 4.8 | 4.8 | 4.8 | 1.2 | 4.8 | 4.8 | 4.8 |
| SP1106 | | 3.0 | 3.0 | 3.0 | 3.0 | 8.0 | 3.0 | 3.0 | 3.0 |
| Laromer LR8863 | | 6.0 | 6.0 | 6.0 | 6.0 | 6.0 | 6.0 | 6.0 | 6.0 |

TABLE 1-continued

| Shrinkage | Example A1 | Example A2 | Example A3 | Example A4 | Example A5 | Comparative Example A1 | Comparative Example A2 | Comparative Example A3 |
|---|---|---|---|---|---|---|---|---|
| EA-1010LC | 6.0 | | | | 3.0 | | | |
| BI 7982 | 14.3 | 14.3 | 14.3 | 14.3 | 14.3 | 14.3 | 14.3 | 14.3 |
| 4HBA | 4.2 | 4.2 | 4.2 | 4.2 | 4.2 | 4.2 | 4.2 | 4.2 |
| Melamine | 1.0 | 1.0 | 1.0 | 1.0 | 1.0 | 1.0 | 1.0 | 1.0 |
| BYK-315N | 0.2 | 0.2 | 0.2 | 0.2 | 0.2 | 0.2 | 0.2 | 0.2 |
| pigment blue 15:3 | 0.2 | 0.2 | 0.2 | 0.2 | 0.2 | 0.2 | 0.2 | 0.2 |
| pigment yellow 147 | 0.4 | 0.4 | 0.4 | 0.4 | 0.4 | 0.4 | 0.4 | 0.4 |
| Total (parts by mass) | 125.9 | 125.9 | 125.9 | 125.9 | 125.8 | 125.9 | 125.9 | 125.9 |

The product names and abbreviations in Table 1 are as follows.

EBECRYL 150: EO-modified bisphenol A diacrylate, manufactured by DAICEL-ALLNEX LTD.

HBPE-4: EO-modified hydrogenated bisphenol A diacrylate (adduct of 4 mol of EO), manufactured by DKS Co., Ltd.

EBECRYL 40: Pentaerythritol alkoxy tetraacrylate, manufactured by DAICEL-ALLNEX LTD.

HDDA: 1,6-Hexanediol diacrylate, manufactured by DKS Co., Ltd.

DPGDA: Dipropylene glycol diacrylate, manufactured by TOYO CHEMICALS CO., LTD.

LC9: 1,9-Nonanediol diacrylate, manufactured by DKS Co., Ltd.

EBECRYL 11: Polyethylene glycol 600 diacrylate, manufactured by DAICEL-ALLNEX LTD.

Omnirad 379: 2-(Dimethylamino)-2-[(4-methylphenyl)methyl]-1-[4-(4-morp holinyl)phenyl]-1-butanone, manufactured by IGM Resins ITX: 2-Isopropylthioxanthone, manufactured by Nippon Kayaku Co., Ltd.

Omnirad TPO: 2,4,6-Trimethylbenzoyldiphenylphosphine oxide, manufactured by Omnirad SP1106: Octadecafunctional dendrimer: Mw1630, 25° C., viscosity 400 cps, manufactured by Miwon Specialty Chemical Co., Ltd.

Laromer LR 8863: EO-modified trimethylolpropane triacrylate (adduct of 6 mol of EO)

EA-1010LC: (Meth)acryloyl group-containing bisphenol A epoxy resin (monofunctional), manufactured by SHIN-NAKAMURA CHEMICAL Co., Ltd.

BI 7982: Trifunctional block isocyanate, manufactured by Baxenden Chemicals Ltd.

4HBA: 4-Hydroxybutyl acrylate, manufactured by Nihon Kasei Co., Ltd.

Melamine: manufactured by Nissan Chemical Corporation

BYK-315N: Silicon-based surface conditioner, manufactured by BYK Japan KK

Pigment Blue 15:3: Phthalocyanine-based blue pigment

Pigment Yellow 147: Anthraquinone-based yellow pigment

*Shrinkage indicates the volumetric shrinkage of each product.

The shrinkage of a photopolymerizable monomer was calculated by the following method.

The densities of components (A) and (B) before and after being cured were measured under the following conditions.

Apparatus used: Pycnometer
Enclosed liquid: Distilled water
Temperature: Room temperature (25° C.)

Next, the volumetric shrinkage was calculated by the following calculation expression.

Expression: $S = (\rho C - \rho L)/\rho C \times 100$
S=Volumetric shrinkage (%)
$\rho C$=Density after curing
$\rho L$=Density before curing 2. Preparation and Evaluation of Test Substrates 2-1. Evaluation of Crack Resistance after High-Temperature Treatment Using the obtained curable composition of each Example and each Comparative Example, test substrates were prepared under the following conditions:

<Preparation Conditions of Test Substrates>

Base material: Copper clad laminate

Polishing: Buffing (Double buffing with Scotch brite SF (corresponding to #600) and UEF (corresponding to #1000))

Application: Applicator (manufactured by ERICHSEN), film thickness 30 μm during application Preliminary curing condition: 300 mJ/cm$^2$, high-pressure mercury lamp (HMW-713 manufactured by ORC) used as a light source Thermosetting condition: 150° C. for 60 minutes, DF610 (manufactured by Yamato Scientific Co., Ltd.) used as a heater UV bump: 1000 mJ/cm$^2$, high-pressure mercury lamp (HMW-713 manufactured by ORC) used as a light source Using NIS-20-82C manufactured by EIGHTECH TECTRON CO., LTD., the temperature inside a reflowing oven was measured 5 times (see FIG. 1) under the same conditions as the reflow conditions in advance at the following conveyor speed and heat source set temperature to confirm that there was no significant variation. Thereafter, under the same conditions, the test substrates obtained above were subjected to reflow treatment by air reflow.

Conveyor speed: Passing 1.0 m/min≈1 zone (about 35 cm) in about 20 seconds

Heat source set temperature: A 210° C., B 190° C., C to F 185° C., G 265° C., H 285° C., I to J Cooling process by fan The reflow treatment was performed up to 3 times, and from the second time onward, the presence/absence of cracks in the cured coating film on the test substrate was checked each time the reflow treatment was performed. The results are shown in Table 2.

TABLE 2

| | Example | | | | | Comparative Example | | |
|---|---|---|---|---|---|---|---|---|
| | A1 | A2 | A3 | A4 | A5 | A1 | A2 | A3 |
| After 2 times of reflowing | 0 | 0 | 0 | 0 | 0 | 0 | 0 | Cracked on the whole |

TABLE 2-continued

|  | Example | | | | | Comparative Example | | |
| --- | --- | --- | --- | --- | --- | --- | --- | --- |
|  | A1 | A2 | A3 | A4 | A5 | A1 | A2 | A3 |
| After 3 times of reflowing | ○ | ○ | ○ | ○ | ○ | ○ | ○ | Cracked on the whole |

As shown in Table 2, when the photopolymerizable monomer having a cyclic skeleton and a shrinkage of less than 10% (A) and the photopolymerizable bifunctional monomer having a viscosity at 25° C. of 100 mPa·s or less and a shrinkage of 10% or more and 20% or less (B) were contained, the obtained coating films did not crack even after a thermal history of three times of ref lowing, and thus had sufficient crack resistance.

2-2. Evaluation of Properties of Coating Films after High Temperature Treatment

Using the curable compositions of Examples A1 to 5 and Comparative Examples A1 to 3 obtained in "1. Preparation of compositions", each test substrate was prepared under the same conditions as "2-1. Evaluation of crack resistance after high temperature treatment".

The prepared samples were immersed in a solder bath at 260° C. for 10 seconds according to the method of JIS C-5012.

Thereafter, the coating film properties of each test substrate after solder immersion treatment were evaluated according to the following "2-2-1. Adhesion to copper clad laminate" and "2-2-2. Pencil hardness".

2-2-1. Adhesion to Copper Clad Laminate

A cross-cut tape peeling test (JIS K 5600) was performed using each prepared test substrate. Table 3 shows the proportion in percentage of the coating film remaining after the test.

2-2-2. Pencil Hardness

The pencil hardness of the surface of each prepared test substrate was measured according to JIS K 5600-5-4. Table 3 shows the pencil hardness of the coating film surface.

TABLE 3

|  | Example | | | | | Comparative Example | | |
| --- | --- | --- | --- | --- | --- | --- | --- | --- |
| Test item | A1 | A2 | A3 | A4 | A5 | A1 | A2 | A3 |
| Cross-cut after 260° C. 10 seconds × 3 treatment | 100 | 100 | 100 | 100 | 100 | 20 | 70 | 0 |
| Pencil hardness | 5H | 5H | 4H | 4H | 3H | HB | H | B |

As shown in Table 3, when the photopolymerizable monomer having a cyclic skeleton and a shrinkage of less than 10% (A) and the photopolymerizable bifunctional monomer having a viscosity at 25° C. of 100 mPa·s or less and a shrinkage of 10% or more and 20% or less (B) were contained, the obtained coating films even after a thermal history of three times of reflowing had good adhesion to a conductor on a substrate and had a sufficient coating film hardness. On the other hand, the coating films of Comparative Examples A1 to 3 were softened after the soldering process and, moreover, may be peeled off from the conductor. Accordingly, the coating films of the Comparative Examples are judged as having poor solder heat resistance.

2-3. Evaluation of Properties of Coating Films after Electroless Plating Treatment Moreover, concerning each test substrate prepared in "2-1. Evaluation of crack resistance after high temperature treatment", plating was performed on the cured coating films under the conditions of 0.5 μm nickel and 0.03 μm gold using a commercially available electroless nickel plating and electroless gold plating bath.

Thereafter, the coating film properties were evaluated according to the above "2-2-1. Adhesion to copper clad laminate" and "2-2-2. Pencil hardness". The results are shown in Table 4.

TABLE 4

|  | Example | | | | | Comparative Example | | |
| --- | --- | --- | --- | --- | --- | --- | --- | --- |
| Test item | A1 | A2 | A3 | A4 | A5 | A1 | A2 | A3 |
| Cross-cut after gold plating treatment | 100 | 100 | 100 | 100 | 100 | 50 | 100 | 0 |
| Pencil hardness | 4H | 5H | 4H | 4H | 3H | 2H | 3H | HB |

As shown in Table 4, it was found that while Examples A1 to 5 show good adhesion to a conductor and sufficient hardness of the formed coating films, in Comparative Examples A1 and A3, the adhesion of the formed coating films to a conductor was poor, and the chemical resistance was small.

3. Evaluation of Inkjet Dischargeability

Inkjet dischargeability during inkjet printing was investigated using the following apparatus. The evaluation criteria are as follows.

Droplets can be continuously and stably jetted straight: ○
Droplets cannot be stably jetted: x <Evaluation of Inkjet Dischargeability>
<Inkjet Printer Discharge Conditions>

Apparatus: Piezoelectric inkjet printer (Material Printer DMP-2831 manufactured by FUJIFILM Global Graphic Systems Co., Ltd. was used (head volume 10 pL, temperature 50° C.)

The flying state of droplets was observed with a camera attached to the printer from the start of discharging to 10 minutes later.

The results are shown in Table 5.

TABLE 5

|  | Example | | | | | Comparative Example | | |
| --- | --- | --- | --- | --- | --- | --- | --- | --- |
|  | A1 | A2 | A3 | A4 | A5 | A1 | A2 | A3 |
| Evaluation | ○ | ○ | ○ | ○ | ○ | ○ | x | ○ |

As shown in Table 5, Examples A1 to 5 had excellent inkjet dischargeability.

Example B

Next, Example B will now be described.

Examples B1 to 8 and Comparative Examples B1 to 2

1. Preparation of Compositions

Components were blended in the proportions (unit: parts by mass) shown in Table 6 and stirred by a dissolver.

Thereafter, the mixtures were dispersed for 2 hours by a bead mill using 1 mm zirconia beads, and thus compositions of the present invention (Examples B1 to 8) and comparative compositions (Comparative Examples B1 and B2) were obtained.

Viscoat #1000: Dendrimer polyester acrylate oligomer (a dendrimer mainly composed of multi-branched (dendrimer-type) polyester acrylate having an acrylate group at a terminal), manufactured by Osaka Organic Chemical Industry Ltd.

TABLE 6

| | Example B1 | Example B2 | Example B3 | Example B4 | Example B5 | Example B6 | Example B7 | Example B8 | Comparative ExampleB1 | Comparative ExampleB2 |
|---|---|---|---|---|---|---|---|---|---|---|
| (A') ABE-300 | 18 | | | | | | | | | |
| (A') BPE-4 | | 18 | 24 | 30 | 36 | | 21 | 10 | | |
| (A') HBPE-4 | | | | | | 24 | | | | |
| BPE-10 | | | | | | | | | | 18 |
| (B1')DPGDA | 36 | 36 | 36 | 36 | 36 | 36 | 50 | 46 | 36 | 36 |
| (B2') A-NOD-N | 6 | 6 | 6 | 6 | 6 | 6 | 6 | 6 | 6 | 6 |
| (B2') HDDA | 27 | 27 | 27 | 21 | 15 | 27 | 12 | 18 | 46 | 22 |
| Laromer LR8863 | 6 | 6 | 6 | 6 | 6 | 6 | 6 | 6 | 6 | 6 |
| (C) Omnirad379 | 3.6 | 3.6 | 3.6 | 3.6 | 3.6 | 3.6 | 3.6 | 6.0 | 3.6 | 3.6 |
| (C) ITX | 0.3 | 0.3 | 0.3 | 0.3 | 0.3 | 0.3 | 0.3 | 0.9 | 0.3 | 0.3 |
| (C) TPO | 4.8 | 4.8 | 4.8 | 4.8 | 4.8 | 4.8 | 1.2 | 1.2 | 4.8 | 4.8 |
| Viscoat#1000 | 3.0 | 3.0 | 3.0 | 3.0 | 3.0 | 3.0 | 3.0 | 8.0 | 3.0 | 3.0 |
| EA-1010LC | 6.0 | 6.0 | | | | | 3.0 | 3.0 | | 6.0 |
| 4HBA | 4.2 | 4.2 | 4.2 | 4.2 | 4.2 | 4.2 | 4.2 | 4.2 | 4.2 | 4.2 |
| BI7982 | 14 | 14 | 14 | 14 | 14 | 14 | 14 | 14 | 14 | 14 |
| Melamine | 0.7 | 0.7 | 0.7 | 0.7 | 0.7 | 0.7 | 0.7 | 0.7 | 0.7 | 0.7 |
| Phthalocyanine blue | 0.2 | 0.2 | 0.2 | 0.2 | 0.2 | 0.2 | 0.2 | 0.2 | 0.2 | 0.2 |
| Chromophthal yellow AGR | 0.36 | 0.4 | 0.4 | 0.4 | 0.4 | 0.4 | 0.4 | 0.4 | 0.4 | 0.4 |
| BYK-315N | 0.15 | 0.2 | 0.2 | 0.2 | 0.2 | 0.2 | 0.2 | | 0.2 | 0.2 |
| Composition viscosity (mPa·s, 50° C., 100 rpm) | ◎ | ◎ | ◎ | ○ | ○ | ◎ | ◎ | ◎ | ◎ | ◎ |
| Total (parts by mass) | 129.82 | 129.52 | 129.52 | 129.52 | 129.52 | 129.52 | 125.92 | 124.00 | 125.25 | 125.25 |

The product names and abbreviations in Table 6 are as follows.

ABE-300: EO-modified bisphenol A diacrylate (adduct of 3 mol of EO), manufactured by SHIN-NAKAMURA CHEMICAL Co., Ltd.

BPE-4: EO-modified bisphenol A diacrylate (adduct of 4 mol of EO), manufactured by DKS Co., Ltd.

HBPE-4: EO-modified hydrogenated bisphenol A diacrylate (adduct of 4 mol of EO), manufactured by DKS Co., Ltd.

BPE-10: EO-modified bisphenol A diacrylate (adduct of 10 mol of EO), manufactured by DKS Co., Ltd.

DPGDA: Dipropylene glycol diacrylate, manufactured by TOYO CHEMICALS CO., LTD.

A-NOD-N: 1,9-Nonanediol diacrylate, manufactured by SHIN-NAKAMURA CHEMICAL Co., Ltd.

HDDA: 1, 6-Hexanediol diacrylate, manufactured by DKS Co., Ltd.

Laromer LR 8863: EO-modified trimethylolpropane triacrylate (adduct of 6 mol of EO)

Omnirad 379: 2-(Dimethylamino)-2-[(4-methylphenyl)methyl]-1-[4-(4-morp holinyl)phenyl]-1-butanone, manufactured by IGM Resins ITX: 2-Isopropylthioxanthone, manufactured by Nippon Kayaku Co., Ltd.

TPO: 2,4,6-Trimethylbenzoyldiphenylphosphine oxide, manufactured by IGM Resins

EA-1010LC: (Meth)acryloyl group-containing bisphenol A epoxy resin (monofunctional), manufactured by SHIN-NAKAMURA CHEMICAL CO., Ltd.

BI 7982: Trifunctional block isocyanate, manufactured by Baxenden Chemicals Ltd.

4HBA: 4-Hydroxybutyl acrylate, manufactured by Nihon Kasei Co., Ltd.

Melamine: manufactured by Nissan Chemical Corporation

Phthalocyanine blue: Phthalocyanine-based blue pigment,

Chromophthal yellow AGR: Anthraquinone-based yellow pigment,

BYK-315N: Silicon-based surface conditioner, manufactured by BYK Japan KK

Composition viscosity: Viscosity at 50° C. measured according to JIS Z 8803 immediately after dispersion by a bead mill was determined according to the following criteria.

◎ Less than 15 mPa·s

○ 15 mPa·s or more and less than 150 mPa·s x Viscosity exceeding 150 mPa·s

2. Preparation and Evaluation of Test Substrates 2-1. Evaluation of Crack Resistance after High-Temperature Treatment Using the obtained curable composition of each Example and Comparative Example, test substrates were prepared under the following conditions.

<Preparation Conditions of Test Substrates>

Base material: Copper clad laminate

Polishing: Buffing (Double buffing with Scotch brite SF (corresponding to #600) and UEF (corresponding to #1000))

Application: Applicator (manufactured by ERICHSEN), film thickness 30 μm during application Preliminary curing condition: 300 mJ/cm$^2$, high-pressure mercury lamp (HMW-713 manufactured by ORC) used as a light source Thermosetting condition: 150° C. for 60 minutes, DF610 (manufactured by Yamato Scientific Co., Ltd.) used as a heater UV bump: 1000 mJ/cm$^2$, high-pressure mercury lamp (HMW-713 manufactured by ORC) used as a light source Using NIS-20-82C manufactured by EIGHTECH TECTRON CO., LTD., the temperature inside a reflowing oven was measured 5 times (see FIG. 1) under the same conditions as the reflow conditions in advance at the following conveyor speed and heat source set temperature to confirm that there was no significant variation. Thereafter, under the same conditions, the test substrates obtained above were subjected to reflow treatment by air reflow.

Conveyor speed: Passing 1.0 m/min≈1 zone (about 35 cm) in about 20 seconds

Heat source set temperature: A 210° C., B 190° C., C to F 185° C., G 265° C., H 285° C., I to J Cooling process by fan The reflow treatment was performed up to 5 times, and from the second time onward, the presence/absence of cracks in the cured coating film on the test substrate was checked each time the reflow treatment was performed. The results are shown in Table 7.

TABLE 7

|  | Example | | | | | | | | Comparative Example | |
|---|---|---|---|---|---|---|---|---|---|---|
|  | B1 | B2 | B3 | B4 | B5 | B6 | B7 | B8 | B1 | B2 |
| After 2 times of reflowing | 0 | 0 | 0 | 0 | 0 | 0 | 0 | 0 | x | 0 |
| After 3 times of reflowing | 0 | 0 | 0 | 0 | 0 | 0 | 0 | 0 | — | 0 |
| After 4 times of reflowing | 0 | 0 | 0 | 0 | 0 | 0 | 0 | 0 | — | 0 |
| After 5 times of reflowing | 0 | 0 | 0 | 0 | 0 | 0 | 0 | 0 | — | x |

As shown in Table 7, when the (meth) acrylate monomer having a cyclic skeleton and having a number of alkylene oxide modifications of one or more and six or less (A'), the bifunctional (meth) acrylate monomer having no cyclic skeleton and having two or more alkylene glycol structures (B1'), and the bifunctional (meth) acrylate monomer having no cyclic skeleton and having a monoalkylene glycol structure (B2') were used in combination, the obtained coating films did not crack even after a thermal history of five times of reflowing, and thus had sufficient crack resistance. On the other hand, Comparative Examples (Comparative Examples 1 and 2) not containing the (meth) acrylate monomer having a cyclic skeleton and having a number of alkylene oxide modifications of one or more and six or less (A') cracked after reflowing and thus had unsatisfactory post-heating crack resistance.

2-2. Evaluation of Properties of Coating Films after High Temperature Treatment

Using the curable compositions of the Examples and Comparative Examples obtained in "1. Preparation of compositions" of Example B, each test substrate was prepared under the same conditions as "2-1. Evaluation of crack resistance after high temperature treatment" of Example B as well.

The prepared samples were immersed in a solder bath at 260° C. for 10 seconds according to the method of JIS C-5012.

Thereafter, the coating film properties of each test substrate after solder immersion treatment were evaluated according to the following "2-2-1. Adhesion to copper clad laminate" and "2-2-2. Pencil hardness".

2-2-1. Adhesion to Copper Clad Laminate

A cross-cut tape peeling test (JIS K 5600) was performed using each prepared test substrate. Table 8 shows the proportion in percentage of the coating film remaining after the test.

2-2-2. Pencil Hardness

The pencil hardness of the surface of each prepared test substrate was measured according to JIS K 5600-5-4. Table 8 shows the pencil hardness of the coating film surface.

TABLE 8

| Test item | Example | | | | | | | | Comparative Example | |
|---|---|---|---|---|---|---|---|---|---|---|
|  | B1 | B2 | B3 | B4 | B5 | B6 | B7 | B8 | B1 | B2 |
| Cross-cut after 260° C. 10 seconds × 3 treatment | 100 | 100 | 100 | 100 | 100 | 100 | 100 | 100 | 50 | 0 |
| Pencil hardness | 5H | 5H | 5H | 5H | 4H | 4H | 4H | 3H | 2H | B |

As shown in Table 8, when the (meth) acrylate monomer having a cyclic skeleton and having a number of alkylene oxide modifications of one or more and six or less (A'), the bifunctional (meth) acrylate monomer having no cyclic skeleton and having two or more alkylene glycol structures (B1'), and the bifunctional (meth) acrylate monomer having no cyclic skeleton and having a monoalkylene glycol structure (B2') were used in combination, the obtained coating films had good adhesion to a conductor on a substrate even after thermal history of three times of reflowing, and thus had sufficient coating film hardness. On the other hand, Concerning Comparative Example B1 and Comparative Example B2, the coating film hardness was deteriorated after the soldering process, moreover the adhesion of the coating films to a conductor on a substrate was poor, the coating films were softened after the soldering process, and moreover the coating films may be peeled off from the conductor. Accordingly, the coating films of the Comparative Examples are judged as having poor solder heat resistance.

2-3. Evaluation of Properties of Coating Films After Electroless Plating Treatment Moreover, concerning each test substrate prepared in "2-1. Evaluation of crack resistance after high temperature treatment" of Example B, plating was performed on the cured coating films under the conditions of 0.5 μm nickel and 0.03 μm gold using commercially available electroless nickel plating and electroless gold plating bath.

Thereafter, the coating film properties were evaluated according to the above "2-2-1. Adhesion to copper clad laminate" and "2-2-2. Pencil hardness" of Example B. The results are shown in Table 9.

TABLE 9

| Test item | Example | | | | | | | | Comparative Example | |
| --- | --- | --- | --- | --- | --- | --- | --- | --- | --- | --- |
| | B1 | B2 | B3 | B4 | B5 | B6 | B7 | B8 | B1 | B2 |
| Cross-cut after plating treatment | 100 | 100 | 100 | 100 | 100 | 100 | 100 | 100 | 50 | 100 |
| Pencil hardness | 4H | 4H | 5H | 5H | 4H | 4H | 4H | 3H | H | 3H |

As shown in Table 9, while Examples B1 to 8 show good adhesion to a conductor and sufficient hardness of the formed coating films, with Comparative Examples B1 to 2 the adhesion of the formed coating films to a conductor was poor. That is, a comparative example (Comparative Example B1) not containing the (meth)acrylate monomer having a cyclic skeleton and having a number of alkylene oxide modifications of one or more and six or less (A') and Comparative Example B2 having a different number of alkylene oxide modifications from that of the (meth) acrylate monomer having a cyclic skeleton and having a number of alkylene oxide modifications of one or more and six or less (A') were found that the chemical resistance is low.

The invention claimed is:

1. A curable composition for inkjet printing, comprising:
   a (meth)acrylate monomer having a cyclic skeleton and having a number of alkylene oxide modifications in a range of one to four;
   a bifunctional (meth)acrylate monomer having no cyclic skeleton and having two or more alkylene glycol structures;
   a bifunctional (meth)acrylate monomer having no cyclic skeleton and having a monoalkylene glycol structure; and
   a photopolymerization initiator.

2. The curable composition for inkjet printing according to claim 1, wherein an amount of the (meth)acrylate monomer having a cyclic skeleton and having a number of alkylene oxide modifications in a range of one to four is in a range of 5 parts by mass to 40 parts by mass per 100 parts by mass of the curable composition.

3. The curable composition for inkjet printing according to claim 1, wherein a mass ratio of the (meth)acrylate monomer having a cyclic skeleton and having a number of alkylene oxide modifications in a range of one to four to a total amount of the bifunctional (meth)acrylate monomer having no cyclic skeleton and having two or more alkylene glycol structures and the bifunctional (meth)acrylate monomer having no cyclic skeleton and having a monoalkylene glycol structure is in a range of 0.10 to 0.70.

4. The curable composition for inkjet printing according to claim 1, wherein a mass ratio of the bifunctional (meth)acrylate monomer having no cyclic skeleton and having two or more alkylene glycol structures to the bifunctional (meth)acrylate monomer having no cyclic skeleton and having a monoalkylene glycol structure is in a range of 1.0 to 3.0.

5. The curable composition for inkjet printing according to claim 2, wherein a mass ratio of the (meth)acrylate monomer having a cyclic skeleton and having a number of alkylene oxide modifications in a range of one to four to a total amount of the bifunctional (meth)acrylate monomer having no cyclic skeleton and having two or more alkylene glycol structures and the bifunctional (meth)acrylate monomer having no cyclic skeleton and having a monoalkylene glycol structure is in a range of 0.10 to 0.70.

6. The curable composition for inkjet printing according to claim 2, wherein a mass ratio of the bifunctional (meth)acrylate monomer having no cyclic skeleton and having two or more alkylene glycol structures to the bifunctional (meth)acrylate monomer having no cyclic skeleton and having a monoalkylene glycol structure is in a range of 1.0 to 3.0.

7. An electronic component, comprising:
   a cured product of a curable composition for inkjet printing,
   wherein the curable composition comprises a photopolymerizable monomer having a cyclic skeleton and a shrinkage of less than 10%, a photopolymerizable bifunctional monomer having a viscosity at 25° C. of 100 m·Pas or less and a shrinkage in a range of 10% to 20%, and a photopolymerization initiator, and the photopolymerizable bifunctional monomer is a photopolymerizable bifunctional monomer having a viscosity at 25° C. of 100 m·Pas or less and a shrinkage in a range of 10% to 15%.

8. The curable composition for inkjet printing according to claim 3, wherein a mass ratio of the bifunctional (meth)acrylate monomer having no cyclic skeleton and having two or more alkylene glycol structures to the bifunctional (meth)acrylate monomer having no cyclic skeleton and having a monoalkylene glycol structure is in a range of 1.0 to 3.0.

9. An electronic component, comprising:
a cured product of a curable composition for inkjet printing,
wherein the curable composition comprises a (meth)acrylate monomer having a cyclic skeleton and having a number of alkylene oxide modifications in a range of one to six, a bifunctional (meth)acrylate monomer having no cyclic skeleton and having two or more alkylene glycol structures, a bifunctional (meth)acrylate monomer having no cyclic skeleton and having a monoalkylene glycol structure, and a photopolymerization initiator.

10. A cured product of the curable composition of claim 1.

11. An electronic component, comprising:
the cured product of claim 10.

12. The curable composition for inkjet printing according to claim 5, wherein a mass ratio of the bifunctional (meth)acrylate monomer having no cyclic skeleton and having two or more alkylene glycol structures to the bifunctional (meth)acrylate monomer having no cyclic skeleton and having a monoalkylene glycol structure is in a range of 1.0 to 3.0.

13. A cured product of the curable composition of claim 2.

14. An electronic component, comprising:
the cured product of claim 13.

15. The curable composition for inkjet printing according to claim 1, wherein an amount of the (meth)acrylate monomer having a cyclic skeleton and having a number of alkylene oxide modifications in a range of one to four is in a range of 5 parts by mass to 30 parts by mass per 100 parts by mass of the curable composition.

16. The curable composition for inkjet printing according to claim 1, wherein an amount of the (meth)acrylate monomer having a cyclic skeleton and having a number of alkylene oxide modifications in a range of one to four is in a range of 10 parts by mass to 30 parts by mass per 100 parts by mass of the curable composition.

17. The curable composition for inkjet printing according to claim 1, wherein an amount of the bifunctional (meth)acrylate monomer having no cyclic skeleton and having two or more alkylene glycol structures is in a range of 20 parts by mass to 50 parts by mass per 100 parts by mass of the curable composition.

18. The curable composition for inkjet printing according to claim 1, wherein an amount of the bifunctional (meth)acrylate monomer having no cyclic skeleton and having a monoalkylene glycol structure is in a range of 10 parts by mass to 30 parts by mass per 100 parts by mass of the curable composition.

19. The curable composition for inkjet printing according to claim 1, wherein an amount of the bifunctional (meth)acrylate monomer having no cyclic skeleton and having two or more alkylene glycol structures is in a range of 20 parts by mass to 50 parts by mass per 100 parts by mass of the curable composition, and an amount of the bifunctional (meth)acrylate monomer having no cyclic skeleton and having a monoalkylene glycol structure is in a range of 10 parts by mass to 30 parts by mass per 100 parts by mass of the curable composition.

20. The curable composition for inkjet printing according to claim 19, wherein an amount of the photopolymerization initiator is in a range of 0.5 parts by mass to 15 parts by mass per 100 parts by mass of the curable composition.

* * * * *